(12) United States Patent
He et al.

(10) Patent No.: US 10,347,701 B2
(45) Date of Patent: Jul. 9, 2019

(54) ORGANIC LIGHT-EMITTING DISPLAY PANEL, DISPLAY DEVICE AND ORGANIC LIGHT-EMITTING DISPLAY MOTHERBOARD THEREOF

(71) Applicant: Xiamen Tianma Micro-Electronics Co., Ltd., Xiamen (CN)

(72) Inventors: Shui He, Xiamen (CN); Yingteng Zhai, Shanghai (CN); Yongxiang Lin, Xiamen (CN); Hong Lin, Xiamen (CN); Yong Yuan, Shanghai (CN); Zaiwen Zhu, Xiamen (CN); Qitai Ji, Xiamen (CN)

(73) Assignee: Xiamen Tianma Micro-Electronics Co., Ltd., Xiamen (CN)

( * ) Notice: Subject to any disclaimer, the term of this patent is extended or adjusted under 35 U.S.C. 154(b) by 0 days.

(21) Appl. No.: 15/907,842

(22) Filed: Feb. 28, 2018

(65) Prior Publication Data
US 2018/0190742 A1    Jul. 5, 2018

(30) Foreign Application Priority Data

Jan. 2, 2018   (CN) .......................... 2018 1 0000653

(51) Int. Cl.
*H01L 27/32* (2006.01)
*H01L 51/52* (2006.01)

(52) U.S. Cl.
CPC ...... *H01L 27/3248* (2013.01); *H01L 27/3276* (2013.01); *H01L 51/5206* (2013.01); *H01L 2251/55* (2013.01)

(58) Field of Classification Search
None
See application file for complete search history.

(56) References Cited

U.S. PATENT DOCUMENTS

| | | | |
|---|---|---|---|
| 2006/0125390 A1* | 6/2006 | Oh | H01L 27/3276 313/506 |
| 2007/0170859 A1* | 7/2007 | Choi | H01L 27/3276 313/512 |
| 2012/0112224 A1* | 5/2012 | Le Bellac | C03C 17/23 257/98 |
| 2018/0122877 A1* | 5/2018 | Beak | H01L 51/56 |

FOREIGN PATENT DOCUMENTS

CN         102163613 A      8/2011

* cited by examiner

*Primary Examiner* — Raj R Gupta
(74) *Attorney, Agent, or Firm* — Anova Law Group, PLLC

(57) ABSTRACT

An organic light-emitting display panel, a display device, and an organic light-emitting display motherboard are provided. The organic light-emitting display panel includes a base substrate, a metal wire, a first insulation layer, and a conductive portion. The metal wire has an upper surface opposing to the base substrate. A material of the metal wire includes a first metal. The first insulation layer covers the upper surface of the metal wire and includes at least one hollow portion penetrating through the first insulation layer and exposing a portion of the upper surface of the metal wire. The conductive portion is electrically connected to the metal wire, and is not overlapped with the at least one hollow portion. A work function of a material of the conductive portion is G1, a work function of metal silver is G2, a work function of the first metal is G3, and G1>G2>G3.

20 Claims, 13 Drawing Sheets

ID No. 201810000653.8, filed on Jan. 2, 2018, the entirety of which is incorporated herein by reference.

ORGANIC LIGHT-EMITTING DISPLAY PANEL, DISPLAY DEVICE AND ORGANIC LIGHT-EMITTING DISPLAY MOTHERBOARD THEREOF

CROSS-REFERENCES TO RELATED APPLICATIONS

This application claims the priority of Chinese patent application No. 201810000653.8, filed on Jan. 2, 2018, the entirety of which is incorporated herein by reference.

FIELD OF THE DISCLOSURE

The present disclosure generally relates to the field of display technology and, more particularly, relates to an organic light-emitting display panel, a display device and an organic light-emitting display motherboard thereof.

BACKGROUND

An organic light-emitting display panel includes organic light-emitting diodes (OLEDs), and is featured with various advantages, such as self-luminous, wide viewing angle, high contrast, low power consumption and high response speed, etc. Thus, organic light-emitting display panels are increasingly favored by consumers.

However, the reliability of organic light-emitting display panels is highly desired to be improved. The disclosed organic light-emitting display panel and device are directed to solve one or more problems set forth above and other problems.

BRIEF SUMMARY OF THE DISCLOSURE

One aspect of the present disclosure provides an organic light-emitting display panel. The organic light-emitting display panel comprises a base substrate, and a metal wire disposed on the base substrate. The metal wire has a first surface facing the base substrate and an opposing second surface, and the opposing second surface is an upper surface of the metal wire. A material of the metal wire includes a first metal. The organic light-emitting display panel also includes a first insulation layer covering the upper surface of the metal wire. The first insulation layer includes at least one hollow portion, and the at least one hollow portion penetrates through the first insulation layer along a thickness direction of the first insulation layer and exposes a portion of the upper surface of the metal wire. Further, the organic light-emitting display panel includes a conductive portion disposed on the upper surface of the metal wire. Along a direction perpendicular to the base substrate, the conductive portion is not overlapped with the at least one hollow portion, and the conductive portion is electrically connected to the metal wire. A work function of a material of the conductive portion is G1, a work function of metal silver is G2, a work function of the first metal is G3, and G1>G2>G3.

Another aspect of the present disclosure provides a display device. The display device comprises an organic light-emitting display panel. The organic light-emitting display panel includes a base substrate, and a metal wire disposed on the base substrate. The metal wire has a first surface facing the base substrate and an opposing second surface, and the opposing second surface is an upper surface of the metal wire. A material of the metal wire includes a first metal. The organic light-emitting display panel also includes a first insulation layer covering the upper surface of the metal wire. The first insulation layer includes at least one hollow portion, and the at least one hollow portion penetrates through the first insulation layer along a thickness direction of the first insulation layer and exposes a portion of the upper surface of the metal wire. Further, the organic light-emitting display panel includes a conductive portion disposed on the upper surface of the metal wire. Along a direction perpendicular to the base substrate, the conductive portion is not overlapped with the at least one hollow portion, and the conductive portion is electrically connected to the metal wire. A work function of a material of the conductive portion is G1, a work function of metal silver is G2, a work function of the first metal is G3, and G1>G2>G3.

Another aspect of the present disclosure provides an organic light-emitting display motherboard. The organic light-emitting display motherboard comprises a mother base substrate, and a metal wire disposed on the mother base substrate. The metal wire has a first surface facing the mother base substrate and an opposing second surface, and the opposing second surface is an upper surface of the metal wire. A material of the metal wire includes a first metal. The organic light-emitting display motherboard also includes a first insulation layer covering the upper surface of the metal wire. The first insulation layer includes at least one hollow portion, and the at least one hollow portion penetrates through the first insulation layer along a thickness direction of the first insulation layer and exposes a portion of the upper surface of the metal wire. In addition, the organic light-emitting display motherboard includes a conductive portion disposed on the upper surface of the metal wire. Along a direction perpendicular to the mother base substrate, the conductive portion is not overlapped with the at least one hollow portion, and the conductive portion is electrically connected to the metal wire. A work function of a material of the conductive portion is G1, a work function of metal silver is G2, a work function of the first metal is G3, and G1>G2>G3. Further, the organic light-emitting display motherboard includes a plurality of sub-display panel regions, wherein the conductive portion is disposed in a region other than a sub-display panel region.

Other aspects of the present disclosure can be understood by those skilled in the art in light of the description, the claims, and the drawings of the present disclosure.

DETAILED DESCRIPTION

Figure 1:
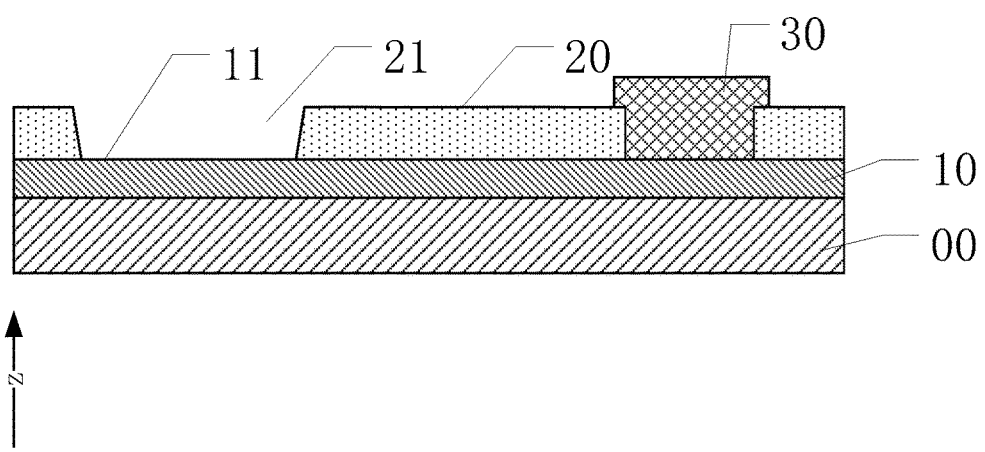
FIG. 1 illustrates a schematic local cross-sectional view of an exemplary organic light-emitting display panel consistent with disclosed embodiments of the present disclosure.

Reference will now be made in detail to exemplary embodiments of the disclosure, which are illustrated in the accompanying drawings. Wherever possible, the same reference numbers will be used throughout the drawings to refer to the same or the alike parts. The described embodiments are some but not all of the embodiments of the present disclosure. Based on the disclosed embodiments, persons of ordinary skill in the art may derive other embodiments consistent with the present disclosure, all of which are within the scope of the present disclosure.

Similar reference numbers and letters represent similar terms in the following Figures, such that once an item is defined in one Figure, it does not need to be further discussed in subsequent Figures.

In existing technologies, film layers in some regions of the organic light-emitting display panel have poor flatness, and the reliability of the organic light-emitting display panel is sustainably low.

A metal wire is provided in the organic light-emitting display panel for transmitting electrical signal. A first insulation layer is provided on a surface of the metal wire for protecting the metal wire. However, due to structural design requirements of the organic light-emitting display panel, a hollow portion is disposed in the first insulation layer. The hollow portion penetrates through the first insulation layer along a thickness direction of the first insulation layer and exposes a portion of an upper surface of the metal wire. Metal particles are adhered to the upper surface of the metal wire in the region where the hollow portion is located. The metal particles cause the upper surface of the metal wire in the region where the hollow portion is located to be uneven, thereby resulting in poor flatness of the subsequently fabricated film layers. The main material of the metal particles is metal silver.

Further, in the manufacturing process of the organic light-emitting display panel, an acid etching solution with PH value of approximately 2-3 is often used. The metal material of the metal wire includes any one of titanium (Ti), aluminum (Al), molybdenum (Mo), copper (Cu), iron (Fe), nickel (Ni), and chromium (Cr). Because work function of metal silver is larger than work function of the metal material of the metal wire, in the acid etching solution, the metal material of the metal wire tends to lose electrons and displace the highly oxidized silver ions ($Ag^+$) in the etching solution. The silver ions ($Ag^+$) form the metal particles after obtaining the electrons. The metal particles will be adhered to the upper surface of the metal wire in the region where the hollow portion is located, resulting in the poor flatness of the subsequently fabricated film layers and low reliability of the organic light-emitting display panel.

For example, the material of the metal wire in the organic light-emitting display panel often includes aluminum (Al). The silver ions ($Ag^+$) will form the metal particles after obtaining the electrons, and the metal particles will be adhered to the upper surface of the aluminum metal wire in the region where the hollow portion is located.

To solve one or more problems set forth above and other problems, the present disclosure provides an organic light-emitting display panel with improved reliability.

FIG. 1 illustrates a schematic diagram of an organic light-emitting display panel consistent with disclosed embodiments of the present disclosure. Referring to FIG. 1, the organic light-emitting display panel may include a base substrate 00, a metal wire 10 disposed on the base substrate 00, a first insulation layer 20 and a conductive portion 30. In particular, the metal wire 10 may have a first surface facing the base substrate 00 and an opposing second surface. The opposing second surface of the metal wire 10 may be an upper surface 11 of the metal wire. The material of the metal wire 10 may include a first metal. The first insulation layer 20 may cover the upper surface 11 of the metal wire 10. The first insulation layer 20 may include at least one hollow portion 21 penetrating through the first insulation layer 20 along a thickness direction of the first insulation layer 20 and exposing a portion of the upper surface 11 of the metal wire. The conductive portion 30 may not overlap with the hollow portion 21 along a direction 'z' perpendicular to the base substrate 00. The conductive portion 30 may be electrically connected to the metal wire 10.

The work function of a material of the conductive portion 30 may be G1, the work function of metal silver may be G2, and the work function of the first metal may be G3, where G1>G2>G3. The work function, also known as a threshold energy, is defined in solid physics as the minimum energy required to move an electron from the interior of a solid to a surface of the object. In general, the work function may refer to the work function of a metal. The value of the work function may indicate the strength of the electrons bound in the metal. The larger the work function, the less likely the electrons are intended to leave the metal. The work function can be simply understood as the ability of the object to possess or capture the electrons. The lower the work function of a substance, the easier the substance is to be oxidized. The higher the work function of a substance, the less likely the substance is to be oxidized.

The disclosed display panel may be an organic light-emitting display panel, which may include a plurality of organic light-emitting diodes (OLEDs) (not illustrated in FIG. 1).

In one embodiment, the base substrate 00 may be a rigid substrate. For example, the base substrate 00 may be made of a glass material. In another embodiment, the base substrate 00 may be a flexible substrate. For example, the base substrate 00 may be made of a resin material. The material of the base substrate 00 is not limited by the present disclosure and may be determined according to various application scenarios.

The metal wire 10 may be disposed on the base substrate 00. Any appropriate films may be disposed between the metal wire 10 and the base substrate 00, which are not limited by the present disclosure. The metal wire 10 may be made of a metal material having desired electrical conductivity. The metal wire 10 may be configured to transmit an electrical signal. For example, the material of the metal wire 10 may include one type of metal, a combination of two or more types of metals, or two or more types of metal alloys, etc. The specific metal material of the metal wire 10 and the function of the electrical signal transmitted by the metal wire 10 are not limited by the present disclosure and may be determined according to various application scenarios.

The first insulation layer 20 may cover the upper surface 11 of the metal wire. The first insulation layer 20 may have an insulating function and may prevent the metal wire 10 from electrical leakage. The first insulation layer 20 may protect the metal wire 10 from being damaged in subsequent processes for fabricating the organic light-emitting display panel. The first insulation layer 20 may be made of an organic material, or an inorganic material, which is not limited by the present disclosure and may be determined according to various application scenarios.

The first insulation layer 20 may include at least one hollow portion 21 penetrating through the first insulation layer 20 along the thickness direction of the first insulation layer 20 and exposing a portion of the upper surface 11 of the metal wire. In the subsequent manufacturing process of the organic light-emitting display panel, the upper surface 11 of the metal wire in the region where the hollow portion 21 is located may not be protected by the first insulation layer 20 and, thus, may be exposed in the acid etching solution. In the acid etching solution, the first metal in the material of the metal wire 10 may easily lose electrons and become first metal cations.

The organic light-emitting display panel may include a plurality of film layer structures. Portion of the film layer structures may be made of metal silver. When patterning the film layer structures containing metal materials using an acid etching solution, the etching solution may include silver ions.

To improve the phenomenon that the silver ions form metal particles on the upper surface 11 of the metal wire in the region where the hollow portion 21 is located, in the disclosed embodiments, the conductive portion 30, which may be electrically connected to the metal wire 10, may be provided. In addition, the work function of the material of the conductive portion may be G1, the work function of the metal silver may be G2, and the work function of the first metal may be G3, where G1>G2>G3.

The conductive portion 30 may resolve the issue that the silver ions form metal particles on the upper surface of the metal wire in the region where the hollow portion 21 is located. The reasons may be explained as follows.

On one hand, the work function of the material of the conductive portion 30 may be configured to be greater than the work function of the first metal.

The work function, also known as a threshold energy, is defined in solid physics as the minimum energy required to move an electron from the interior of a solid to a surface of the object. The larger the work function of a material, the more difficult it is for the material to lose electrons. The smaller the work function of a material, the easier it is for the material to lose electrons. In the disclosed embodiments, the work function of the material of the conductive portion may be G1, the work function of the metal silver may be G2, and the work function of the first metal may be G3, where G1>G2>G3. That is, the work function G1 of the material of the conductive portion 30>the work function G2 of the metal silver>the work function G3 of the first metal. In other words, the material of the conductive portion 30 may be the most difficult to lose electrons, the metal silver may be difficult to lose electrons, and the first metal may be the easiest to lose electrons.

Contact effect is an electrical effect caused by the contact of two different materials, in which the generated electrical effect is different from the electrical effect when the two materials are not in touch with each other. Contact effect is a fairly widespread class of effects, existing between numerous materials such as metal-metal, metal-semiconductor, metal-electrolyte, and metal-oxide, etc.

The contact effect is related to the work function. In one embodiment, when the conductive portion 30 is electrically connected to the metal wire 10, the contact effect may exist between the conductive portion 30 and the metal wire 10. Because the work function of the material of the conductive portion 30 is greater than the work function of the first metal in the metal wire 10, the first metal in the metal wire 10 may be more likely to lose electrons than the material of the conductive portion 30, and, thus, the electrons in the metal wire 10 may move toward the conductive portion 30.

In the manufacturing process of the disclosed organic light-emitting display panel, a potential barrier for the silver ions in the acid etching solution to directly acquire electrons from the metal wire 10 may be substantially large, while a potential barrier for the silver ions to acquire lost electrons of the metal wire 10 through the conductive portion 30 may be substantially small. Thus, the silver ions may not be easily reduced on the surface of the metal wire 10 to form metal particles adhered to the upper surface 11 of the metal wire in the region where the hollow portion 21 is located. On the contrary, the silver ions may tend to be reduced on the surface of the conductive portion 30 to form metal particles which are adhered to the surface of the conductive portion 30. Thus, the upper surface 11 of the metal wire may maintain a substantially smooth and flat structure under the protection of the conductive portion 30. Accordingly, the issues of poor flatness of the subsequently manufactured film layers may be resolved, and the reliability of the organic light-emitting display panel may be improved.

On the other hand, the material of the conductive portion 30 may be the most difficult to lose electrons, the metal silver may be difficult to lose electrons, and the first metal may be the easiest to lose electrons. In other words, the material of the conductive portion 30 may be the easiest to acquire electrons. When the conductive portion 30 is electrically connected to an object containing metal silver, the contact effect may exist between the conductive portion 30 and the object containing metal silver. Electrons of silver may move toward the conductive portion 30, and silver may turn into silver ions. Therefore, when the material of the conductive portion 30 and the silver ions coexist, the material of the conductive portion 30 may preferentially acquire electrons.

In the manufacturing process of the disclosed organic light-emitting display panel, in the acid etching solution, the conductive portion 30 may be easier to acquire electrons than the silver ions. Therefore, the conductive portion 30 may be easier to be reduced, while the silver ions in the etching solution may not be easy to be reduced. The silver ions may not be easy to acquire electrons to form metal particles adhered to the upper surface 11 of the metal wire in the region where the hollow portion 21 is located. Therefore, the upper surface 11 of the metal wire may maintain a substantially smooth and flat structure under the protection of the conductive portion 30. Accordingly, the issues of poor flatness of the subsequently manufactured film layers may be resolved, and the reliability of the organic light-emitting display panel may be improved.

In addition, the conductive portion 30 may not overlap with the hollow portion 21 along the direction 'z' perpendicular to the base substrate 00. That is, the conductive portion 30 may be disposed in a region other than the hollow portion 21, without damaging the hollow structure of the first insulation layer 20 and without affecting the structural design requirements of the organic light-emitting display panel.

Figure 2:
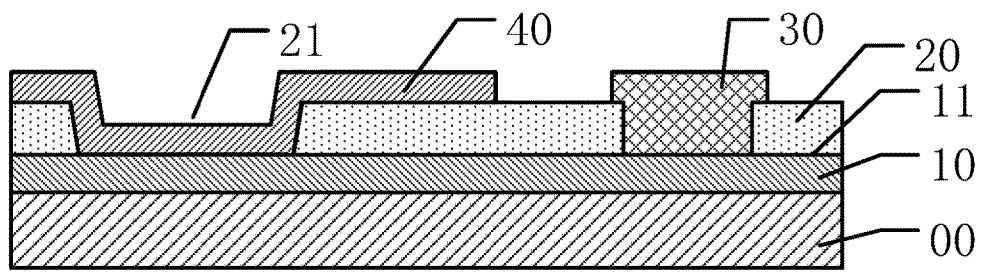
FIG. 2 illustrates a schematic local cross-sectional view of another exemplary organic light-emitting display panel consistent with disclosed embodiments of the present disclosure.

FIG. 2 illustrates a schematic local cross-sectional view of another exemplary organic light-emitting display panel consistent with disclosed embodiments of the present disclosure. The similarities between FIG. 1 and FIG. 2 are not repeated herein, while certain differences may be explained.

As shown in FIG. 2, the base substrate 00 may be a flexible substrate. In one embodiment, the base substrate 00 may be made of polyimide (PI). The organic light-emitting display panel may also include a thin film encapsulation layer 40. The thin film encapsulation layer 40 may cover the upper surface 11 of the metal wire in the region where the hollow portion 21 is located. The thin film encapsulation layer 40 may prevent outside moisture, oxygen and impurities from entering the display panel, and protect the film layer structures inside the organic light-emitting display panel. In one embodiment, in the organic light-emitting display panel, the organic light-emitting diode may be fabricated by a vapor deposition manufacturing process. The fabricated film layer structures may be loose, and the material of the organic light-emitting diode may be easily eroded by moisture, oxygen and impurities in the air. However, the thin film encapsulation layer 40 may be able to protect the organic light-emitting diode.

In certain embodiments, the thin film encapsulation layer 40 may include one, two or three or more film layers. In one embodiment, the thin film encapsulation layer 40 may include organic layers and inorganic layers that are alternatively arranged. The base substrate 00 may be a flexible substrate having a bendable property. In one embodiment, the thin film encapsulation layer 40 may also have desired bendability. For example, the organic light-emitting display panel may be rollable, bendable and foldable. The specific material and film layer structures of the thin film encapsulation layer 40 are not limited by the present disclosure and may be determined according to various application scenarios.

The upper surface 11 of the metal wire in the region where the hollow portion 21 is located may be covered with the thin film encapsulation layer 40. When the metal particles are adhered to the upper surface 11 of the metal wire in the region where the hollow portion 21 is located, the encapsulation performance of the thin film encapsulation layer 40 may be affected, resulting in encapsulation failure of the thin film encapsulation layer 40. Therefore, the yield of the organic light-emitting display panel may be affected.

In the disclosed embodiments, metal particles may not be easily formed to be adhered to the upper surface 11 of the metal wire in the region where the hollow portion 21 is located. Thus, the upper surface 11 of the metal wire may maintain a substantially smooth and flat structure under the protection of the conductive portion 30 without affecting the encapsulation performance of the thin film encapsulation layer 40. Therefore, the reliability of the organic light-emitting display panel may be enhanced, and the yield of the organic light-emitting display panel may be improved.

Figure 3:
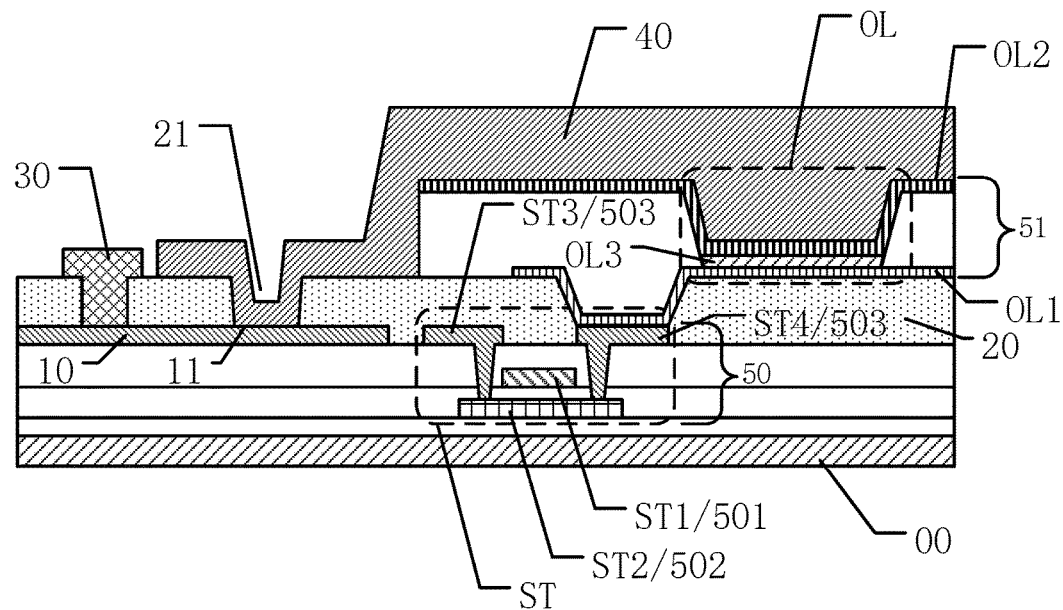
FIG. 3 illustrates a schematic local cross-sectional view of another exemplary organic light-emitting display panel consistent with disclosed embodiments of the present disclosure.

FIG. 3 illustrates a schematic local cross-sectional view of another exemplary organic light-emitting display panel consistent with disclosed embodiments of the present disclosure. The similarities between FIG. 2 and FIG. 3 are not repeated herein, while certain differences may be explained.

As shown in FIG. 3, the organic light-emitting display panel may also include a thin film transistor layer 50 and an organic light-emitting diode layer 51 that are sequentially disposed on the base substrate 00. The thin film transistor layer 50 may include a gate metal layer 501, a semiconductor layer 502 and a source-drain metal layer 503.

In one embodiment, the thin film transistor layer 50 may include a plurality of thin film transistors ST. The thin film transistor ST may include a gate ST1, a semiconductor portion ST2, a source ST3, and a drain ST4. The gate ST1 may be located in the gate metal layer 501, the semiconductor portion ST2 may be located in the semiconductor layer 502, the source ST3 and the drain ST4 may be disposed in the same layer, and in the source-drain metal layer 503.

In one embodiment, the organic light-emitting diode layer 51 may include a plurality of organic light-emitting diodes OL.

In FIG. 3, the number of the thin film transistors ST is one and the number of the organic light-emitting diodes OL is one, which is for illustrative purposes and is not intended to limit the scope of the present disclosure. The number of the thin film transistors ST and the number of the organic light-emitting diodes OL may be any appropriate number, which may be determined according to various application scenarios.

In FIG. 3, a top gate transistor (the gate is disposed above the semiconductor portion) is illustrated, which is for illustrative purposes and is not intended to limit the scope of the present disclosure. The thin film transistor may have either a top gate structure or a bottom gate structure, which is not limited by the present disclosure and may be determined according to various application scenarios.

In one embodiment, the source-drain metal layer 503 may include the metal wire 10. That is, the metal wire 10 may be made of a same material and disposed in a same layer as the source ST3 and the drain ST4. In the manufacturing process of the organic light-emitting display panel, the same metal film layer may be etched using a mask to simultaneously form the metal wire 10, the source ST3 and the drain ST4 in the same manufacturing process.

In one embodiment, the material of the metal wire 10 may include the first metal, which may be metal aluminum. Metal aluminum has desired electrical conductivity, ductility, and, thus, may be a desired material for fabricating the metal wire 10. In one embodiment, the metal wire 10 may include three stacked metal layers. For example, the metal wire may include two metal titanium layers and a metal aluminum layer sandwiched between the two metal titanium layers.

In one embodiment, the first insulation layer 20 may be a planarization (PLN) layer, which may be disposed between the thin film transistor layer 50 and the organic light-emitting diode layer 51. The planarization layer may be made of an organic material. The planarization layer may have a thick film layer and have a planarization effect. The planarization layer may have a first surface facing the base substrate 00 and an opposing second surface. In one embodiment, the thin film transistor layer 50 may have a non-uniform thickness due to the structure of the thin film transistor layer 50. The planarization layer may cover the thin film transistor layer 50. A distance between the opposing second surface of the planarization layer and the base substrate 00 may be uniform, and the opposing second surface of the planarization layer may be substantially flat, which may provide a desired foundation for the subsequent fabrication of the organic light-emitting diode layer 51.

Figure 4:
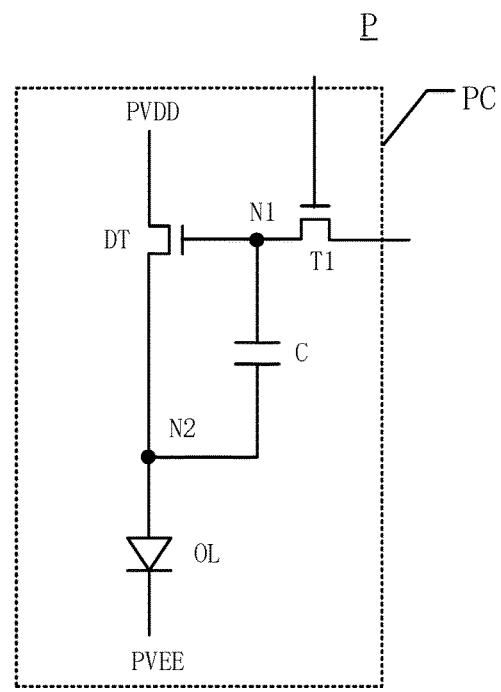
FIG. 4 illustrates a circuit diagram of an exemplary pixel circuit in an exemplary organic light-emitting display panel consistent with disclosed embodiments of the present disclosure.

FIG. 4 illustrates a circuit diagram of an exemplary pixel circuit in an exemplary organic light-emitting display panel consistent with disclosed embodiments of the present disclosure. The similarities between FIG. 3 and FIG. 4 are not repeated herein, while certain differences may be explained.

As shown in FIG. 4, the organic light-emitting display panel may include a plurality of pixels P, and the pixel P may include a pixel circuit PC. FIG. 4 illustrates a structure of one pixel P, which is for illustrative purposes, and is not intended to limit the scope of the present disclosure. The organic light-emitting display panel may include a plurality of pixels P for implementing the display function of the organic light-emitting display panel, i.e., for displaying images.

Referring to FIG. 4, the pixel circuit PC may include an organic light-emitting diode OL, a driving transistor DT, a high-potential signal line PVDD and a low-potential signal line PVEE. The high-potential signal line PVDD may be electrically connected to a source of the driving transistor DT. A drain of the driving transistor DT may be electrically connected to an anode of the organic light-emitting diode OL. The low-potential signal line PVEE may be electrically connected to a cathode of the organic light emitting diode OL. The metal wire 10 may be the high-potential signal line PVDD. A potential on the high-potential signal line PVDD may be higher than a potential on the low-potential signal line PVEE. During the display stage of the display panel, the high-potential signal line PVDD may provide a high-potential voltage to the driving transistor DT to drive the organic light-emitting diode OL to emit light.

In one embodiment, the pixel circuit PC may compensate a threshold voltage of the driving transistor DT, thereby reducing the non-uniformity display phenomenon caused by the threshold voltage shift of the driving transistor DT.

In one embodiment, the pixel circuit PC may also include a first transistor T1 and a capacitive element C. A drain of the first transistor T1 may be electrically connected to a first node N1. A gate of the driving transistor DT may be electrically connected to the first node N1. A first plate of the capacitive element C may be electrically connected to the first node, and a second plate of the capacitive element C may be electrically connected to the anode of the organic light-emitting diode OL.

In FIG. 4, the pixel circuit PC includes two transistors (a driving transistor DT and a first transistor T1), one capacitor C and one light-emitting diode OL, which is for illustrative purposes and is not intended to limit the scope of the present disclosure. The structure of the pixel circuit PC is not limited by the present disclosure and may be determined according to various application scenarios in practical applications. For example, the pixel circuit may include a plurality of transistors and one or more capacitor.

In the disclosed embodiments, the metal wire may be the high-potential signal line PVDD. In one embodiment, the high-potential signal lines PVDD of the plurality of pixels P may be electrically connected to each other.

In the disclosed embodiments, metal particles may be suppressed to be adhered to the surface of the high-potential signal line PVDD in the region where the hollow portion is located may be improved, such that the reliability of the organic light-emitting display panel may be enhanced, and the yield of the organic light-emitting display panel may be increased.

Figure 5:
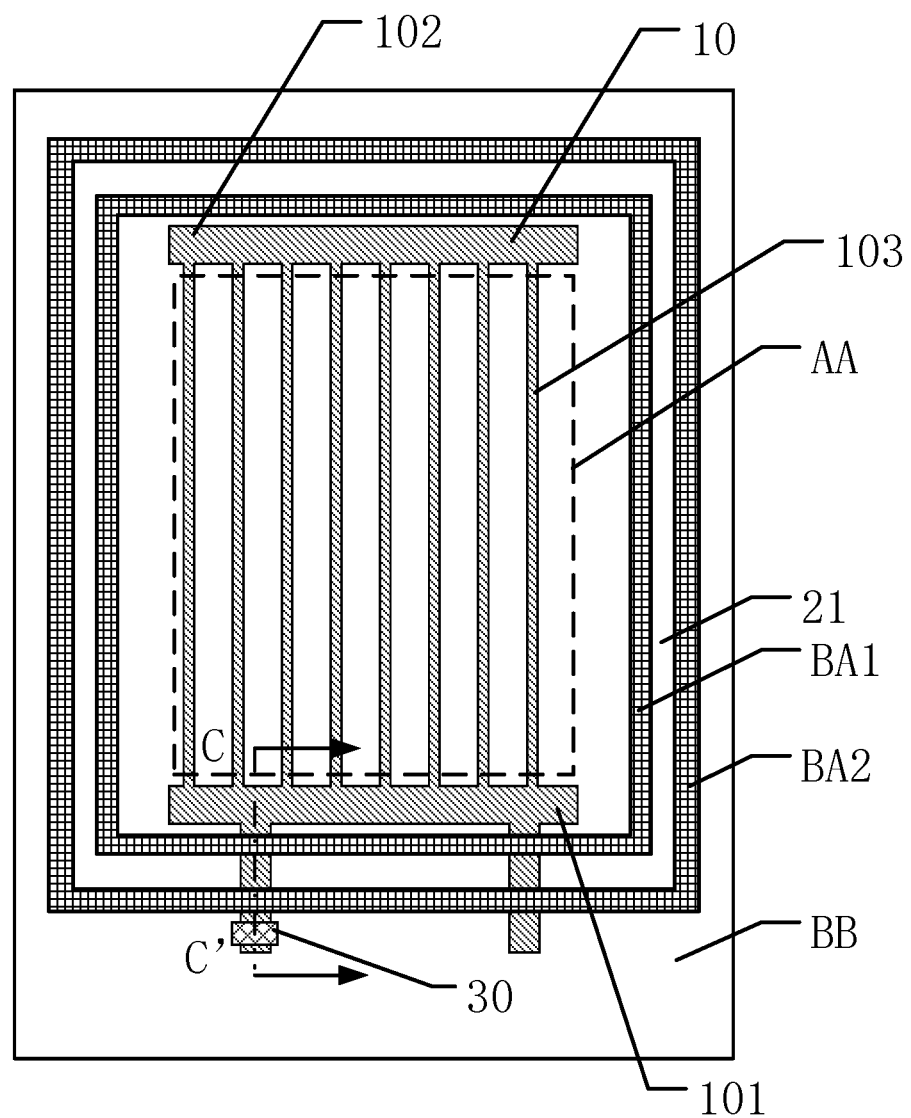
FIG. 5 illustrates a schematic top view of an exemplary organic light-emitting display panel consistent with disclosed embodiments of the present disclosure.
Figure 6:
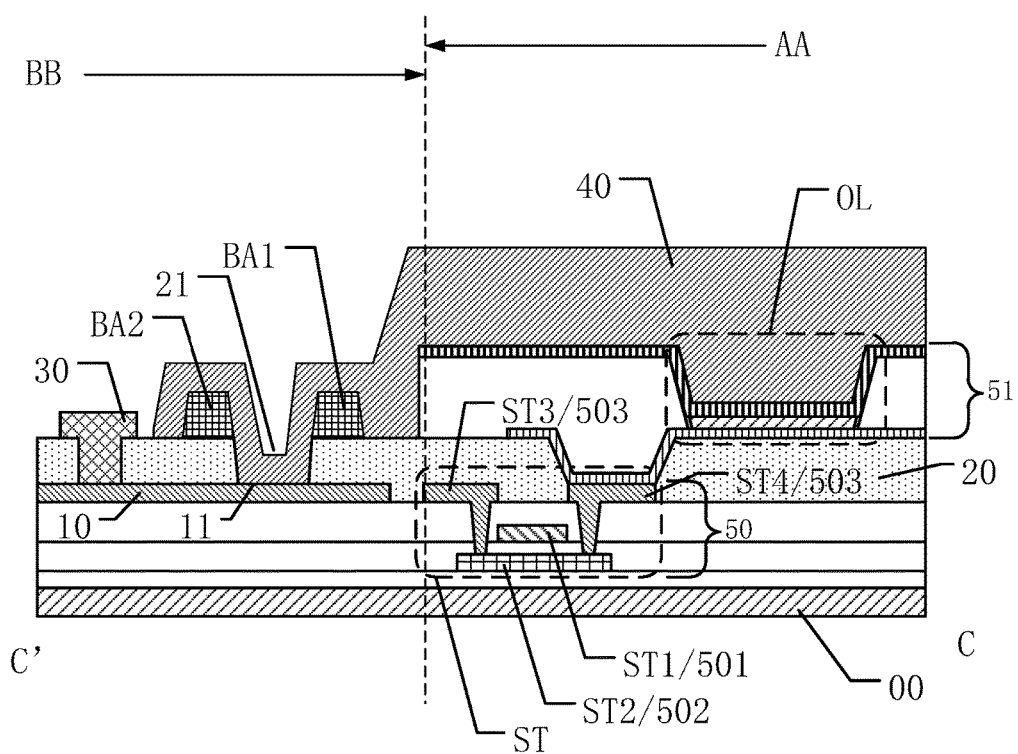
FIG. 6 illustrates a schematic CC'-sectional view of an exemplary organic light-emitting display panel in FIG. 5 consistent with disclosed embodiments of the present disclosure.

FIG. 5 illustrates a schematic top view of an exemplary organic light-emitting display panel consistent with disclosed embodiments of the present disclosure, and FIG. 6 illustrates a schematic CC'-sectional view of an exemplary organic light-emitting display panel in FIG. 5 consistent with disclosed embodiments of the present disclosure. The similarities between FIG. 3 and FIG. 6 are not repeated herein, while certain differences may be explained.

As shown in FIGS. 5-6, the organic light-emitting display panel may include a display region 'AA' and a non-display region 'BB' surrounding the display region 'AA'. The hollow portion 21 may have an annular shape, and may be located in the non-display region 'BB'.

In one embodiment, the first insulation layer 20 may be made of an organic material, and the structure may be substantially loose. Outside moisture, oxygen and impurities in the air may enter the interior of the organic light-emitting display panel through the first insulation layer 20. The hollow portion 21 having an annular shape and disposed in the non-display region 'BB' may separate the first insulation layer 20, and, thus, the hollow portion 21 may cut off the transmission path for the outside moisture, oxygen and impurities in the air to enter the display region 'AA'. Therefore, the outside moisture, oxygen and impurities in the air may be prevented from entering the interior of the organic light-emitting display panel through the first insulation layer 20, and the reliability of the organic light-emitting display panel may be further enhanced accordingly.

The non-display region 'BB' may include a first barrier spacer 'BA1' and a second barrier spacer 'BA2'. The first barrier spacer 'BA1' may be disposed around the display region 'AA', and the second barrier spacer 'BA2' may be disposed around the first barrier spacer 'BA1'. That is, the first barrier spacer 'BA1' may be disposed between the second barrier spacer 'BA2' and the display region 'AA'. The second barrier spacer 'BA2' may have a first surface facing the base substrate 00 and an opposing second surface, and the second barrier spacer 'BA2' may have a first side arranged close to the display region 'AA' and an opposing second side far away from the display region 'AA'.

In one embodiment, the thin film encapsulation layer 40 may cover the display region 'AA' and extend to a region between the first barrier spacer 'BA1' and the second barrier spacer 'BA2'. In another embodiment, the thin film encapsulation layer 40 may cover the display region 'AA' and extend to the opposing second surface of the second barrier spacer 'BA2'. In another embodiment, the thin film encapsulation layer 40 may cover the display region 'AA' and extend to a region at the opposing second side of the second barrier spacer 'BA2'. The metal wire 10 may extend from the display region 'AA' to the region at the second opposing side of the second barrier spacer 'BA2'.

In the disclosed embodiments, the first barrier spacer 'BA1' and the second barrier spacer 'BA2' may be disposed in the non-display region 'BB'. The first barrier spacer 'BA1' and the second barrier spacer 'BA2' may have a dam structure, and a cross-section of the dam structure may have a trapezoid shape. In one embodiment, the first insulation layer 20 may have a first surface facing the base substrate 00 and an opposing second surface. The first barrier spacer 'BA1' and the second barrier spacer 'BA2' may be disposed on the opposing second surface of the first insulation layer 20 and extend along a thickness direction of the organic light-emitting display panel. In one embodiment, the first barrier spacer 'BA1' and the second barrier spacer 'BA2' may include a portion of the first insulation layer 20.

Both the first barrier spacer 'BA1' and the second barrier spacer 'BA2' may be disposed around the display region 'AA', and may prevent outside moisture, oxygen and impurities in the air from entering the display panel. In one embodiment, the thin film encapsulation layer 40 may cover the display region 'AA' and extend to the region between the first barrier spacer 'BA1' and the second barrier spacer 'BA2'. In another embodiment, the thin film encapsulation layer 40 may cover the display region 'AA' and extend to the opposing second surface of the second barrier spacer 'BA2'. In another embodiment, the thin film encapsulation layer 40 may cover the display region 'AA' and extend to the region at the opposing second side of the second barrier spacer 'BA2'.

The thin film encapsulation layer 40 may form an undulating structure in the non-display region 'BB' under the influence of the structures of the first barrier spacer 'BA1' and the second barrier spacer 'BA2'. Accordingly, the outside moisture, oxygen and impurities in the air may be prevent from entering the display region 'AA', and, thus, the organic light-emitting diode OL may be protected from being eroded.

In one embodiment, when the metal wire 10 is the high-potential signal line PVDD (i.e., when the metal wire transmits a high-potential signal), the metal wire 10 may supply a high-potential voltage to a plurality of pixels in the display region. In one embodiment, the metal wire 10 may include a first main wire 101, a second main wire 102, and a plurality of wire traces 103. The first main wire 101 and the second main wire 102 may be disposed on two opposing sides of the display region 'AA', i.e., the two side are opposing to each other. The plurality of wire traces 103 may be disposed in the display region 'AA'. The plurality of wire traces 103 may be electrically connected to the first main wire 101 and the second main wire 102 in the non-display region 'BB', respectively.

In the disclosed embodiments, the hollow portion may be disposed in any appropriate positions of the organic light-emitting display panel, and certain exemplary positions of the hollow portion will be explained in the following, which are for illustrative purposes and are not intended to limit the scope of the present disclosure.

FIG. 5 illustrates a schematic top view of an exemplary organic light-emitting display panel consistent with disclosed embodiments of the present disclosure, and FIG. 6 illustrates a schematic CC'-sectional view of an exemplary organic light-emitting display panel in FIG. 5 consistent with disclosed embodiments of the present disclosure.

As shown in FIGS. 5-6, the hollow portion 21 may be located in the region between the first barrier spacer 'BA1' and the second barrier spacer 'BA2'. The hollow portion 21, the first barrier spacer 'BA1', the second barrier spacer 'BA2' and the thin film encapsulation layer 40 may cooperate to prevent outside moisture, oxygen and impurities in the air from entering the interior of the organic light-emitting display panel through the first insulation layer 20. Therefore, the reliability of the organic light-emitting display panel may be further enhanced.

Figure 7:
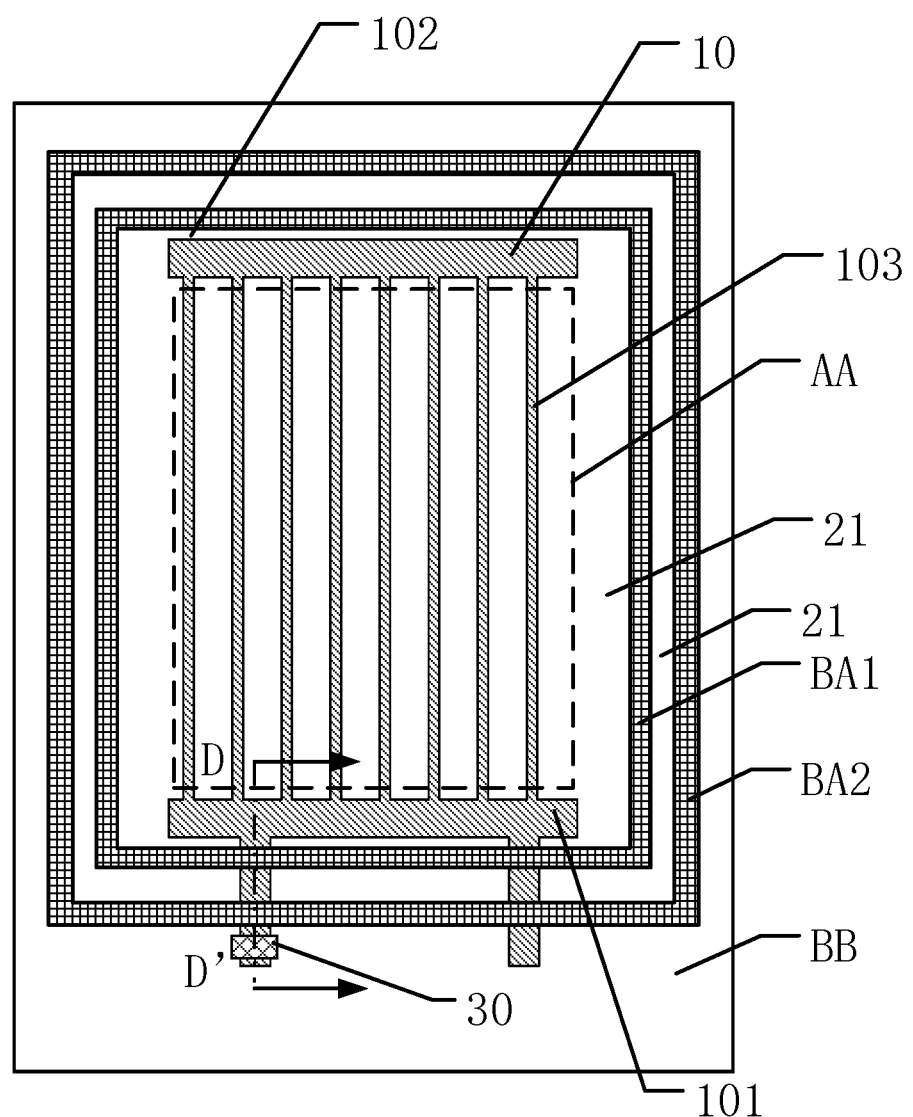
FIG. 7 illustrates a schematic top view of another exemplary organic light-emitting display panel consistent with disclosed embodiments of the present disclosure.
Figure 8:
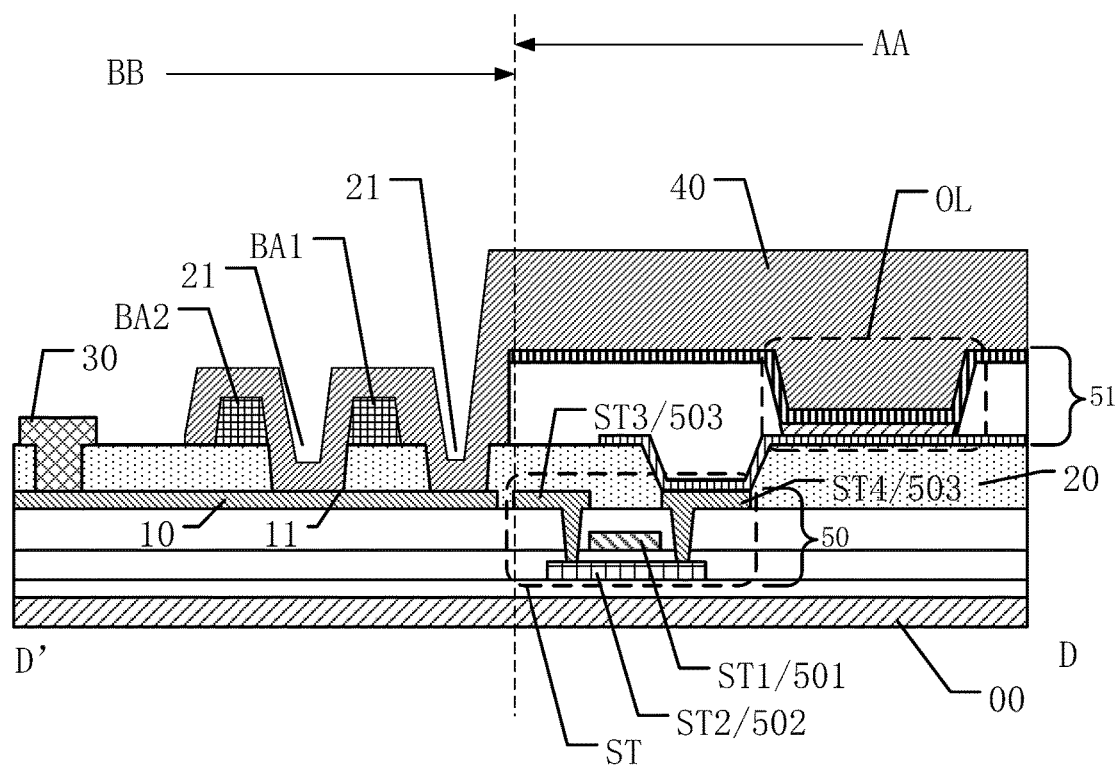
FIG. 8 illustrates a schematic DD'-sectional view of another exemplary organic light-emitting display panel in FIG. 7 consistent with disclosed embodiments of the present disclosure.

FIG. 7 illustrates a schematic top view of another exemplary organic light-emitting display panel consistent with disclosed embodiments of the present disclosure, and FIG. 8 illustrates a schematic DD'-sectional view of another exemplary organic light-emitting display panel in FIG. 7 consistent with disclosed embodiments of the present disclosure. FIG. 7 follows the reference numerals in FIG. 5, FIG. 8 follows the reference numerals in FIG. 6, and the same or similar features are not repeated herein.

As shown in FIGS. 7-8, the hollow portion 21 may be located in the region between the first barrier spacer 'BA1' and the second barrier spacer 'BA2' and, meanwhile, the hollow portion 21 may be located in a region between the first barrier spacer 'BA1' and the display region 'AA'. The hollow portion 21, the first barrier spacer 'BA1', the second barrier spacer 'BA2' and the thin film encapsulation layer 40 may cooperate to prevent outside moisture, oxygen and impurities in the air from entering the interior of the organic light-emitting display panel through the first insulation layer 20. Therefore, the reliability of the organic light-emitting display panel may be further enhanced.

Figure 9:
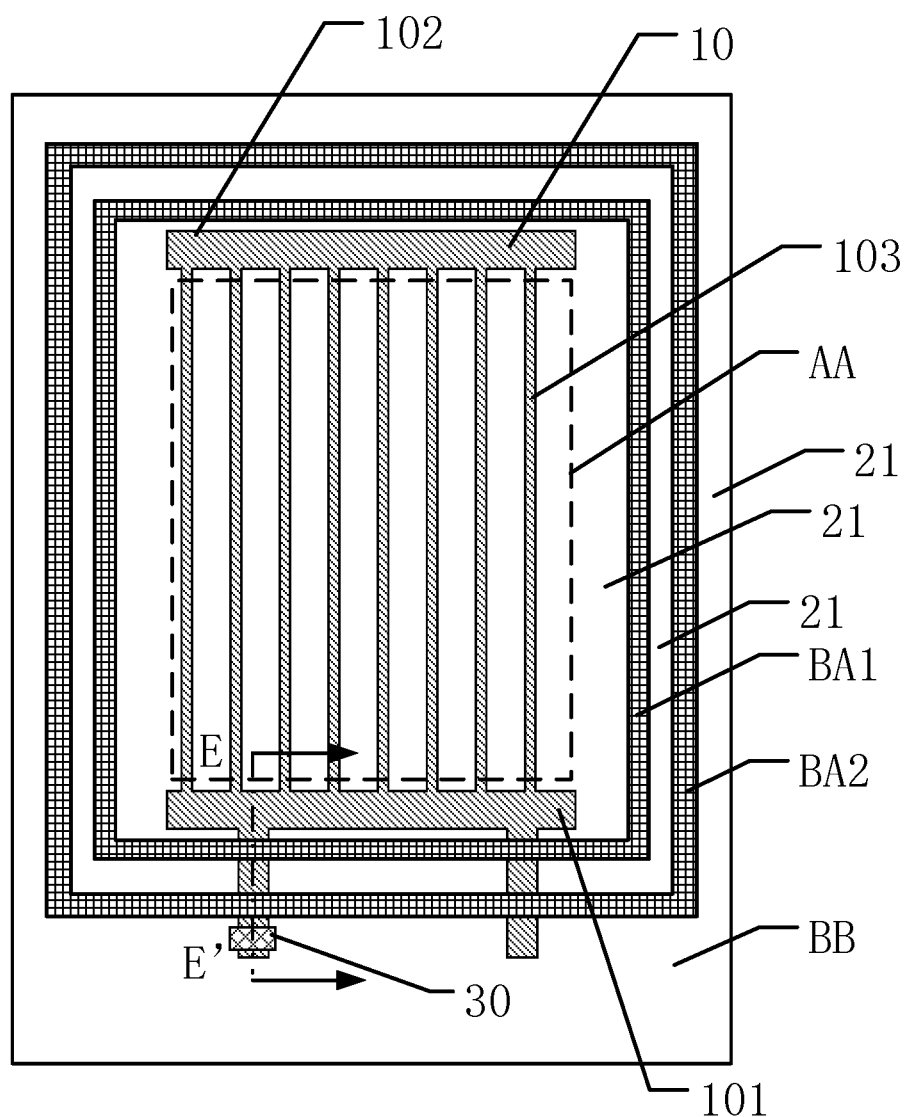
FIG. 9 illustrates a schematic top view of another exemplary organic light-emitting display panel consistent with disclosed embodiments of the present disclosure.
Figure 10:
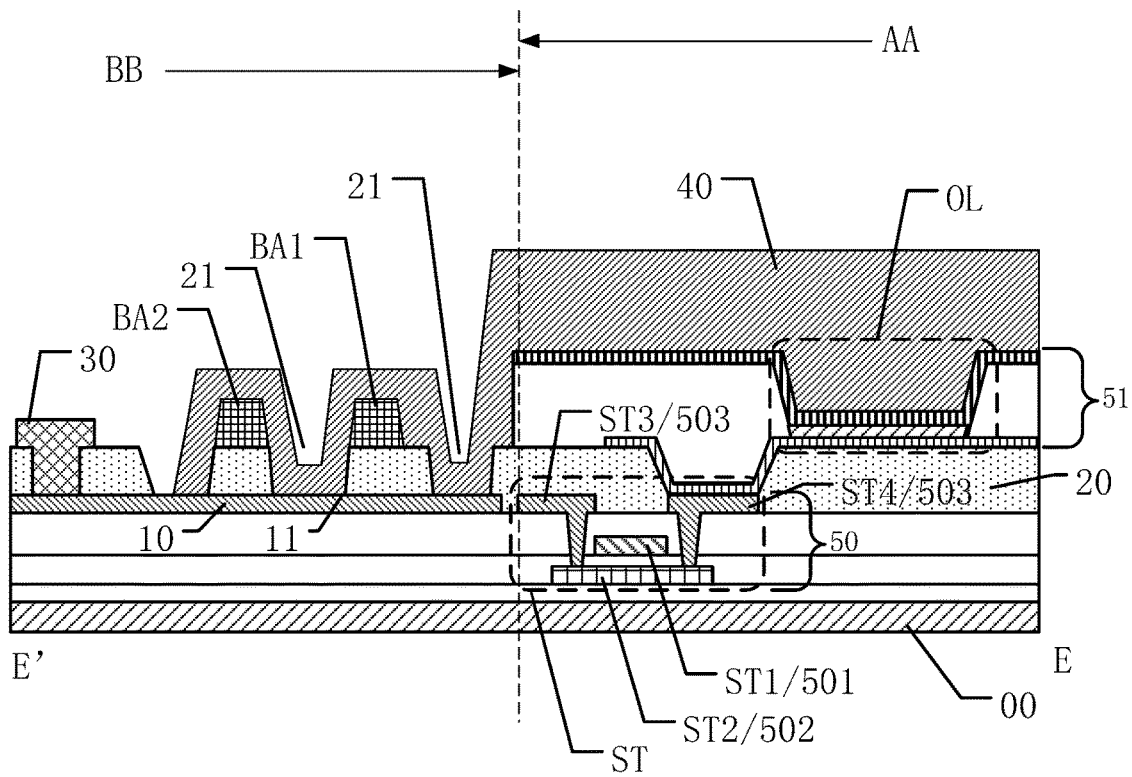
FIG. 10 illustrates a schematic EE'-sectional view of another exemplary organic light-emitting display panel in FIG. 9 consistent with disclosed embodiments of the present disclosure.

FIG. 9 illustrates a schematic top view of another exemplary organic light-emitting display panel consistent with disclosed embodiments of the present disclosure, and FIG. 10 illustrates a schematic EE'-sectional view of another exemplary organic light-emitting display panel in FIG. 9 consistent with disclosed embodiments of the present disclosure. FIG. 9 follows the reference numerals in FIG. 7, FIG. 10 follows the reference numerals in FIG. 8, and the same or similar features are not repeated herein.

As shown in FIGS. 9-10, in addition to the region between the first barrier spacer 'BA1' and the second barrier spacer 'BA2' and the region between the first barrier spacer 'BA1' and the display region 'AA', the hollow portion 21 may also be located in the region at the opposing second side of the second barrier spacer 'BA2'. The opposing second side of the second barrier spacer 'BA2' is the side far away from the display region AA. The hollow portion 21, the first barrier spacer 'BA1', the second barrier spacer 'BA2' and the thin film encapsulation layer 40 may cooperate to prevent outside moisture, oxygen and impurities in the air from entering the interior of the organic light-emitting display panel through the first insulation layer 20. Therefore, the reliability of the organic light-emitting display panel may be further enhanced.

In one embodiment, the hollow portion 21 may be disposed in any one of the region between the first barrier spacer 'BA1' and the second barrier spacer 'BA2', the region between the first barrier spacer 'BA1' and the display region 'AA', and the region at the opposing second side of the second barrier spacer 'BA2'. In another embodiment, the hollow portion 21 may be simultaneously disposed in any two of the region between the first barrier spacer 'BA1' and the second barrier spacer 'BA2', the region between the first barrier spacer 'BA1' and the display region 'AA', and the region at the opposing second side of the second barrier spacer 'BA2'. In another embodiment, the hollow portion 21 may be disposed in all of the region between the first barrier spacer 'BA1' and the second barrier spacer 'BA2', the region between the first barrier spacer 'BA1' and the display region 'AA', and the region at the opposing second side of the second barrier spacer 'BA2'. That is, the hollow portion 21 may be disposed in at least one of the region between the first barrier spacer 'BA1' and the second barrier spacer 'BA2', the region between the first barrier spacer 'BA1' and the display region 'AA', and the region at the opposing second side of the second barrier spacer 'BA2'.

In the disclosed embodiments, the material of the conductive portion 30 may include a conductive metal oxide having a substantially strong oxidation. In the etching solution, the conductive metal oxide may preferentially obtain electrons and undergo a reduction reaction with respect to the silver ions. Therefore, the silver ions in the etching solution may be prevented from undergoing a reduction reaction to form the metal particles and, accordingly, the metal particles may be suppressed to be adhered to the upper surface 11 of the metal wire in the region where the hollow portion 21 is located.

In one embodiment, the conductive portion 30 may be made of at least one of indium oxide ($In_2O_3$), zinc oxide (ZnO), tin oxide ($SnO_2$), and gallium oxide ($Ga_2O_3$). Indium oxide, zinc oxide, tin oxide, and gallium oxide may have substantially strong oxidation. In addition, one selected or a combination of two selected from indium oxide, zinc oxide, tin oxide, and gallium oxide are often used as conductive materials in the organic light-emitting display panel, and may be used for fabricating electrodes.

Through fabricating the conductive portion by using at least one of indium oxide, zinc oxide, tin oxide and gallium oxide, additional raw materials may not be introduced for manufacturing the organic light-emitting display panel, and new processes may not be developed for fabricating the conductive portion. Therefore, the cost of the organic light-emitting display panel may be reduced, and the production efficiency may be improved.

Figure 11:
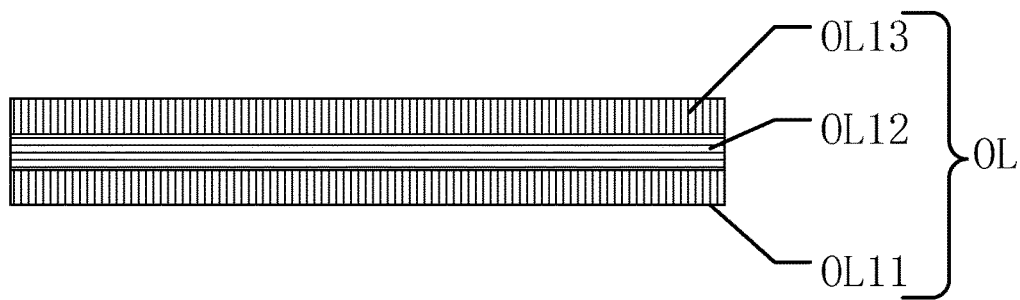
FIG. 11 illustrates exemplary film layers of an anode of another organic light-emitting display panel in FIG. 3 consistent with disclosed embodiments of the present disclosure.

In certain embodiments, referring to FIG. 3 and FIG. 11, the organic light-emitting diode layer 51 may include a plurality of organic light-emitting diodes OL. The organic light-emitting diode OL may include an anode OL1, a cathode OL2, and an organic light-emitting portion OL3 disposed between the anode OL1 and the cathode OL2. When desired voltages are applied to the anode OL1 and the cathode OL2, respectively, holes in the anode OL1 and electrons in the cathode OL2 may be combined in the organic light-emitting portion OL3 to generate light. In one embodiment, different colors of light may be emitted by configuring the materials of the organic light-emitting portion OL3.

The anode OL1 may include a first sub-layer OL11, a second sub-layer OL12 and a third sub-layer OL13 stacked together. The materials of the first sub-layer OL11 and the third sub-layer OL13 may include indium tin oxide (ITO), also known as a tin-doped indium oxide, or a mixture of indium oxide ($In_2O_3$) and tin oxide ($SnO_2$). The indium tin oxide may have desired electrical conductivity and may be transparent in a thin film form. The material of the second sub-layer OL12 may include silver. The second sub-layer OL12 may have a desired effect of reflecting light. Portion of light generated by the organic light-emitting portion OL3 may be emitted from the cathode OL2 under the reflection of the second sub-layer OL12, and the organic light-emitting display panel may have a top-emission structure.

In the manufacturing process of the organic light-emitting display panel, in the process of patterning the anode OL1, because the material of the second sub-layer OL12 includes silver, the etching solution may include silver ions ($Ag^+$). In one embodiment, the material of the metal wire 10 may include aluminum (Al). In one embodiment, the metal wire 10 may be the high-potential signal line PVDD.

Figure 12:
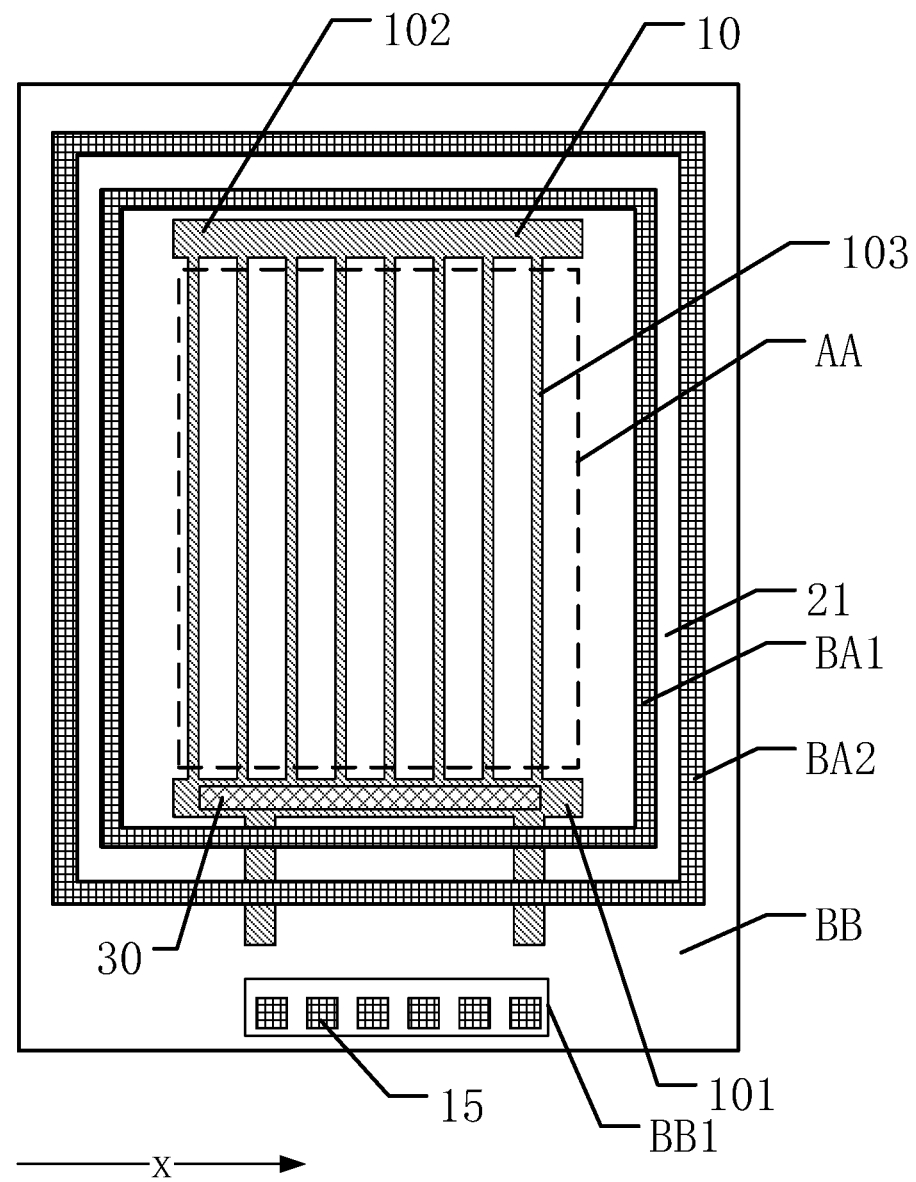
FIG. 12 illustrates a schematic top view of another exemplary organic light-emitting display panel consistent with disclosed embodiments of the present disclosure.

In certain embodiments, referring to FIG. 3, FIG. 11 and FIG. 12, the non-display region 'BB' may include a bonding region 'BB1', and the bonding region 'BB1' may include a plurality of conductive welding pads 15. In one embodiment, the bonding region 'BB1' may be bonded with an integrated circuit (IC), or a flexible printed circuit (FPC), etc.

Because the metal wire 10 desires to receive a voltage signal, the metal wire 10 may extend to the bonding region 'BB1' of the organic light-emitting display panel. The bonding region 'BB1' may be located in the non-display region 'BB' of the display panel. The metal wire 10 may obtain external electrical signals of the display panel through the IC or the flexible circuit board bonded to the bonding region 'BB1'.

In one embodiment, the metal wire 10 in a lower border region may extend to other film layers by a wire-changing method thereby avoiding the exposure of the upper surface 11 of the metal wire through the hollow portion 21 in the first insulation layer 20. However, the design of the wire-changing method may be substantially difficult. In particular, a plurality of signal lines, and circuit elements may be disposed in the non-display region 'BB'. For example, a side of the non-display region 'BB' where the bonding region is located is often referred to the lower border region, and the plurality of signal lines, and circuit elements, such as demux circuit, etc., may be disposed in the lower border region. When the metal wire 10 in the lower border region extends to other conductive layers by the wire-changing method, the metal wire 10 may intersect the signal lines and circuit elements in the lower border region, causing a short circuit. The structure of the originally complicated lower border region may become more complicated, and the design difficulty of the organic light-emitting display panel may be increased. Therefore, the metal wire 10 in the lower border region may not be desired to extend to other conductive layers by the wire-changing method.

When the hollow portion 21 has an annular shape and is located in the non-display region 'BB', the issue that the hollow portion 21 in the first insulation layer 20 exposes the upper surface 11 of the metal wire may not be resolved by the wire-changing method. In the disclosed embodiments, the conductive portion 30 may be provided, thereby resolving the issue that the metal particles are adhered to the upper surface 11 of the metal wire in the region where the hollow portion 21 is located.

In one embodiment, the conductive portion 30 and the anode OL1 may be made of a same material. In the manufacturing process of the organic light-emitting display panel, the anode OL1 and the conductive portion 30 may be simultaneously formed in a same process without introducing any additional process for manufacturing the conductive portion 30.

In the manufacturing process of the organic light-emitting display panel, during the process of patterning the anode OL1, the etching solution may include silver ions ($Ag^+$). In one embodiment, the material of the metal wire 10 may include aluminum (Al). Aluminum (Al) may easily lose electrons in an acid etching solution, and the chemical reaction formula is shown in the following:

$$Al \rightarrow Al^{3+} + 3e^-\qquad\text{(Formula 1)}.$$

The metal wire 10 may be electrically connected to the conductive portion 30, and the work function of the material of the conductive portion 30 may be greater than the work function of the first metal. In the manufacturing process of the disclosed organic light-emitting display panel, the silver ions may easily undergo a reduction reaction on the surface of the conductive portion 30 to form metal particles, which are adhered to the surface of the conductive portion 30. The chemical reaction formula for silver ions ($Ag^+$) obtaining electrons is shown in the following:

$$Ag^+ + e^- \rightarrow Ag\qquad\text{(Formula 2)}.$$

In addition, because the work function of the conductive portion is larger than the work function of metal silver, indium oxide ($In_2O_3$) may be easier to obtain electrons than silver ions ($Ag^+$), and silver ions may be difficult to obtain electrons. Portion of the indium oxide ($In_2O_3$) may undergo a reduction reaction, and the chemical reaction formula for indium oxide ($In_2O_3$) obtaining electrons is shown in the following:

$$In_2O_3 + 6e^- \rightarrow 2In + 3O_2\qquad\text{(Formula 3)}.$$

In the disclosed embodiments, the phenomenon that the silver ions undergo a reduction reaction to form the metal particles, which are adhered to the upper surface 11 of the metal wire in the region where the hollow portion 21 is located, may be suppressed. Thus, the upper surface 11 of the metal wire may maintain a substantially smooth and flat structure under the protection of the conductive portion 30. Accordingly, the issues of poor flatness of the subsequently manufactured film layers and low reliability of the organic light-emitting display panel may be resolved, and the reliability of the organic light-emitting display panel may be improved.

FIG. 12 illustrates a schematic top view of another exemplary organic light-emitting display panel consistent with disclosed embodiments of the present disclosure. As shown in FIG. 12, the conductive portion 30 may be disposed in the non-display region 'BB', and may not occupy the space of the display region 'AA'. Therefore, the conductive portion 30 may be prevented from affecting the display effect of the display region 'AA'. In one embodiment, the conductive portion 30 may have a strip shape extended along a first direction 'x'. The conductive portion 30 may be disposed in a side of the display region 'AA', and the side of the display region 'AA' may be close to the bonding region 'BB1'. In one embodiment, the conductive portion 30 may overlap with the first main wire 101. The conductive portion 30 may be formed into a strip shape with a large area, facilitating the conductive portion 30 to sufficiently undergo a reduction reaction. Therefore, the phenomenon that the silver ions in the etching solution undergo a reduction reaction to form the metal particles, which are adhered to the upper surface 11 of the metal wire in the region where the hollow portion 21 is located, may be suppressed, and the reliability of the organic light-emitting display panel may be enhanced.

In one embodiment, a shape of the organic light-emitting display panel is rectangular, which is for illustrative purposes and is not intended to limit the scope of the present disclosure. In another embodiment, when the shape of the organic light-emitting display panel is a circular, or an oval, etc., the shape and extending direction of the conductive portion 30 may be adaptively adjusted, which are not limited by the present disclosure.

Figure 13:
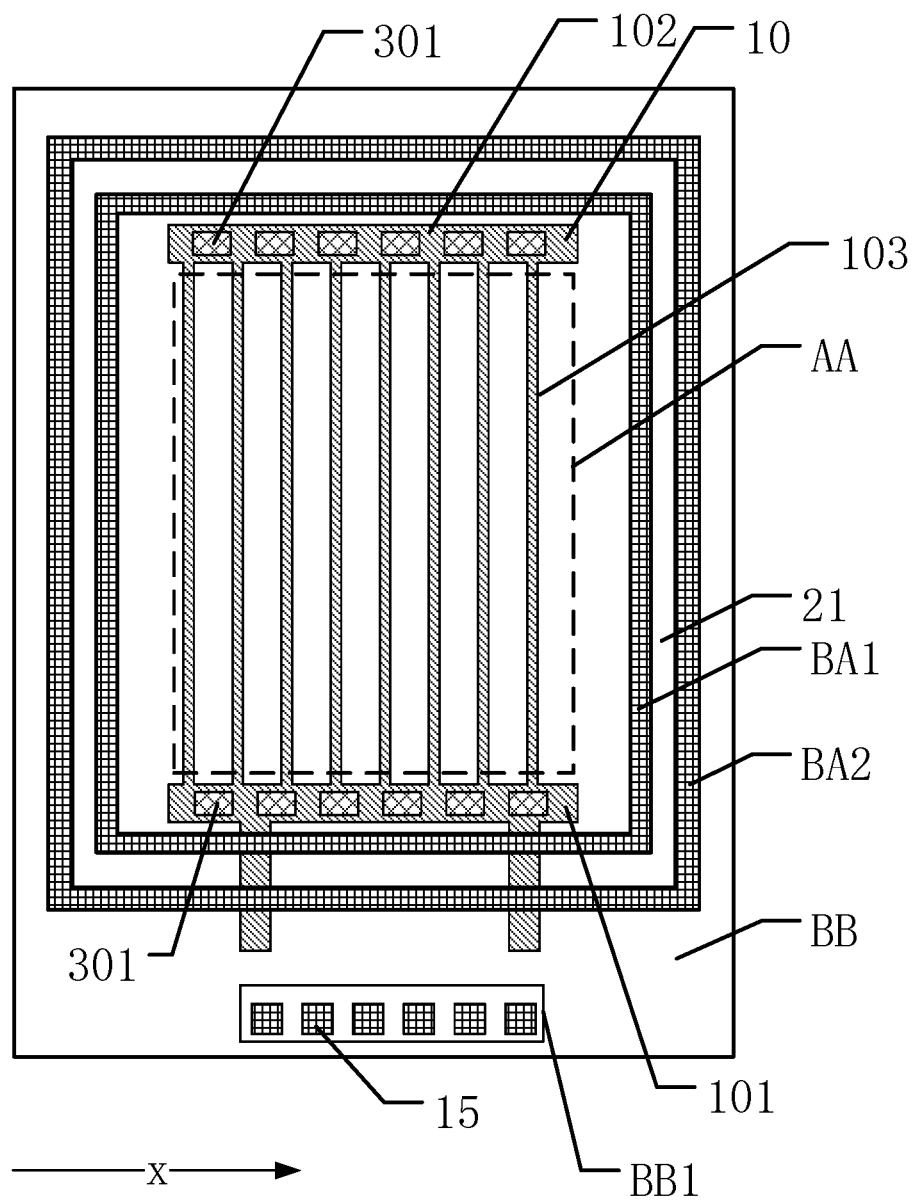
FIG. 13 illustrates a schematic top view of another exemplary organic light-emitting display panel consistent with disclosed embodiments of the present disclosure.

FIG. 13 illustrates a schematic top view of another exemplary organic light-emitting display panel consistent with disclosed embodiments of the present disclosure. As shown in FIG. 13, the conductive portion 30 may include a plurality of sub-conductive portions 301. A sub-conductive portion 301 may overlap with the metal wire 10 in the direction perpendicular to the base substrate 00. In one embodiment, the sub-conductive portion 301 may overlap with the first main wire 101. In embodiment, the sub-conductive portion 301 may overlap with the second main wire 102. In one embodiment, as shown in FIG. 13, the conductive portion 30 may include the plurality of sub-conductive portions 301. Each sub-conductive portion 301 may be physically independent of each other, and may be electrically connected to the metal wire 10.

Through providing the plurality of sub-conductive portions 301, the exposed film edge of the conductive portion 30 in the etching solution may increase. On one hand, the contact area between the conductive portion 30 and silver ions may increase, thereby facilitating the silver ions to obtain the electrons lost by the metal wire 10 through the conductive portion 30, and facilitating the silver ions to form metal particles on the surface of the conductive portion 30. On the other hand, the conductive portion 30 may promptly and sufficiently undergo a reduction reaction in the etching solution. Thus, the phenomenon that the silver ions in the etching solution undergo a reduction reaction to form the metal particles, which are adhered to the upper surface 11 of the metal wire in the region where the hollow portion 21 is located, may be suppressed, and the reliability of the organic light-emitting display panel may be enhanced.

In one embodiment, a shape of the sub-conductive portion 301 is a rectangle, which is for illustrative purposes and is not intended to limit the scope of the present disclosure. The shape and number of the sub-conductive portions 301 are not limited by the present disclosure and may be determined according to various application scenarios.

Figure 14:
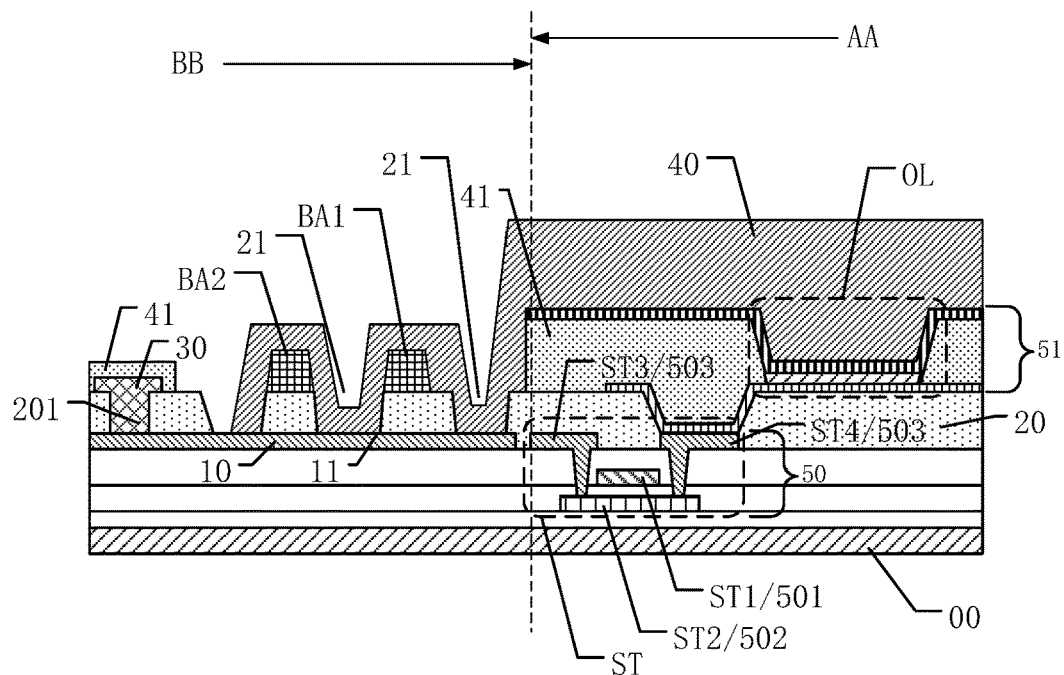
FIG. 14 illustrates a schematic local cross-sectional view of another exemplary organic light-emitting display panel consistent with disclosed embodiments of the present disclosure.

FIG. 14 illustrates a schematic local cross-sectional view of another exemplary organic light-emitting display panel consistent with disclosed embodiments of the present disclosure. The similarities between FIG. 10 and FIG. 14 are not repeated herein, while certain differences may be explained.

As shown in FIG. 14, the organic light-emitting diode layer 51 may also include a pixel defining layer 41. The conductive portion may have a first surface facing the base substrate 00 and an opposing second surface. The pixel defining layer 41 may cover the opposing second surface of the conductive portion 30. In one embodiment, the pixel defining layer 41 may include an opening region, and at least a portion of the organic light-emitting diode OL may be disposed in the opening region. The pixel defining layer 41 covering the opposing second surface of the conductive portion 30 may protect the conductive portion 30 from being etched or damaged during the subsequent manufacturing process of the organic light-emitting display panel.

In one embodiment, referring to FIG. 14, the conductive portion 30 may be disposed on the opposing second surface of the first insulation layer 20. The first insulation layer 20 may include a first through-hole 201. The conductive portion 30 may be electrically connected to the metal wire 10 through the first through-hole 201.

The present disclosure also provides a display device. The display device may include any one of the disclosed organic light-emitting display panels.

Figure 15:
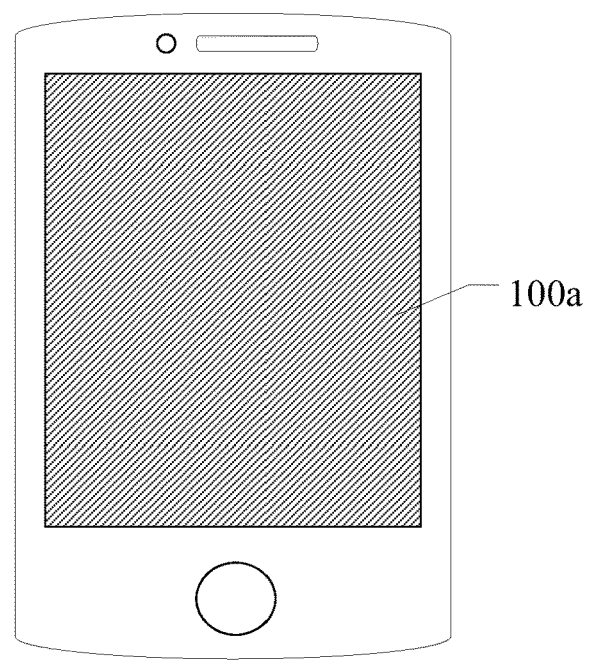
FIG. 15 illustrates a schematic diagram of an exemplary display device consistent with disclosed embodiments of the present disclosure.

FIG. 15 illustrates a schematic diagram of an exemplary display device consistent with disclosed embodiments of the present disclosure. Referring to FIG. 15, the display device 100 may include any one of the disclosed organic light-emitting display panels 100a. FIG. 15 illustrates the display device 100 using a mobile phone, which is for illustrative purposes and is not intended to limit the scope of the present disclosure. The disclosed display device may be any other display device with a display function, such as a computer, a television, a car display device, etc., and is not limited by the present disclosure. The disclosed display device may have the features of the disclosed organic light-emitting display panel. Details may be referred to the corresponding description of the disclosed organic light-emitting display panel, and are not repeated herein.

The present disclosure also provides an organic light-emitting display motherboard.

Figure 16:
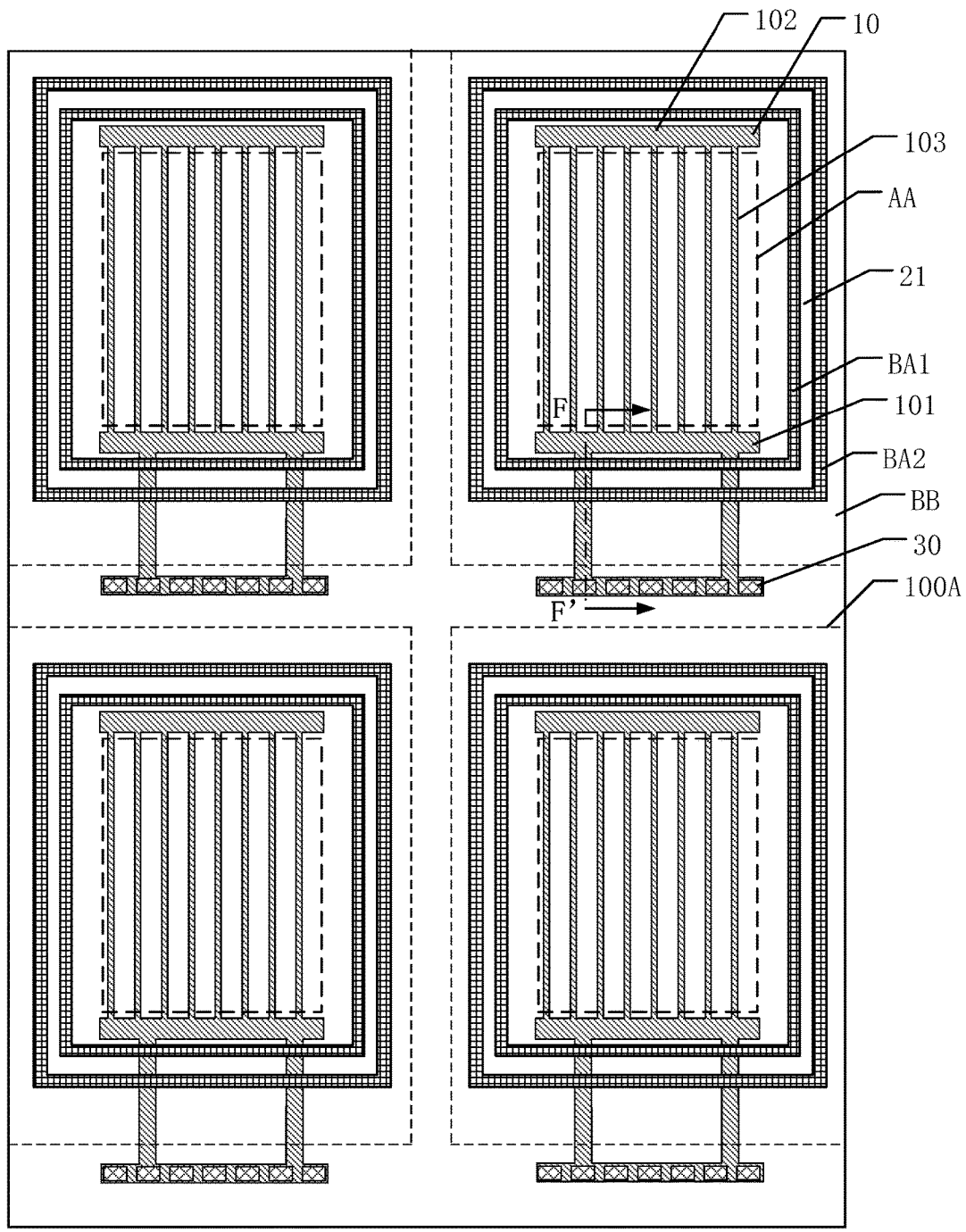
FIG. 16 illustrates a schematic top view of an exemplary organic light-emitting display motherboard consistent with disclosed embodiments of the present disclosure.
Figure 17:
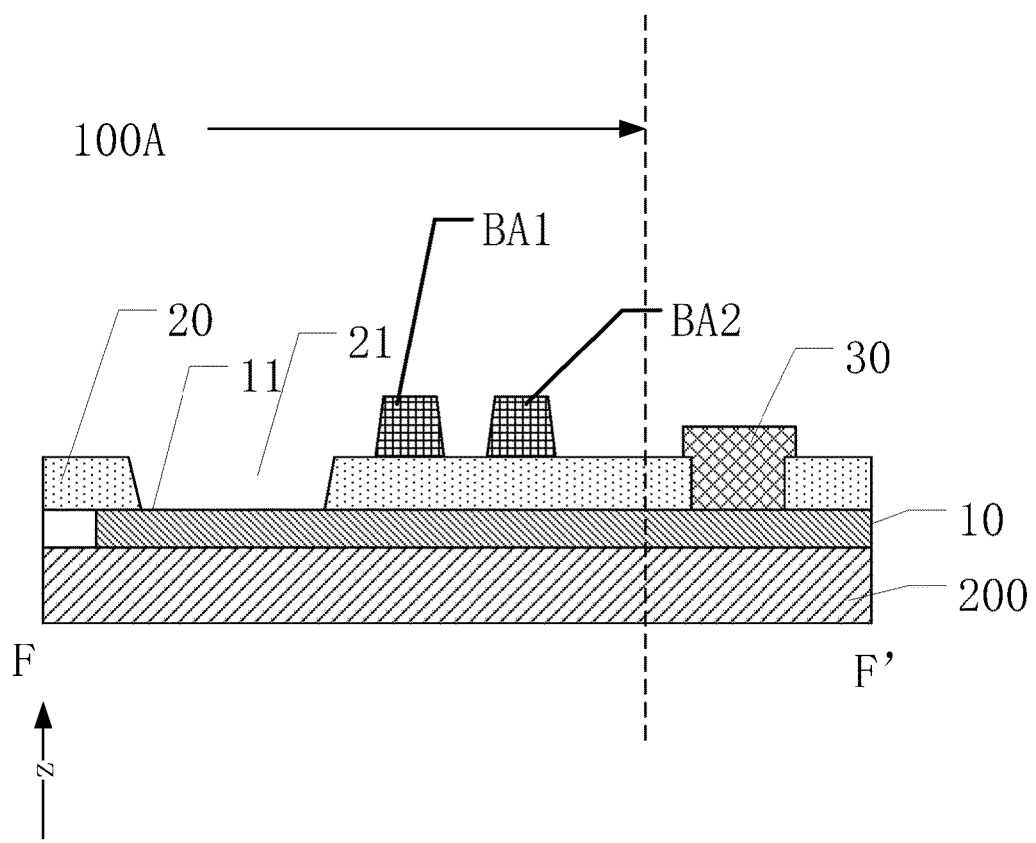
FIG. 17 illustrates a schematic FF'-sectional view of an exemplary organic light-emitting display motherboard in FIG. 16 consistent with disclosed embodiments of the present disclosure.

FIG. 16 illustrates a schematic top view of an exemplary organic light-emitting display motherboard consistent with disclosed embodiments of the present disclosure, and FIG. 17 illustrates a schematic FF'-sectional view of an exemplary organic light-emitting display motherboard in FIG. 16 consistent with disclosed embodiments of the present disclosure. Referring to FIG. 16 and FIG. 17, the organic light-emitting display motherboard may include a mother base substrate 200, a metal wire 10 disposed on the mother base substrate 200, a first insulation layer 20 and a conductive portion 30. In particular, the metal wire 10 may have a first surface facing the mother base substrate 200 and an opposing second surface. The opposing second surface of the metal wire 10 may be an upper surface 11 of the metal wire. The material of the metal wire 10 may include a first metal. The first insulation layer 20 may cover the upper surface 11 of the metal wire. The first insulation layer 20 may include at least one hollow portion 21, and the at least one hollow portion 21 may penetrate through the first insulation layer 20 along a thickness direction of the first insulation layer 20, and expose a portion of the upper surface 11 of the metal wire 10. The conductive portion 30 may not overlap with the hollow portion 21 along a direction perpendicular to the mother base substrate 200. The conductive portion 30 may be electrically connected to the metal wire 10.

The work function of a material of the conductive portion 30 may be G1, the work function of metal silver may be G2, and the work function of the first metal may be G3, where G1>G2>G3. The organic light-emitting display motherboard may include a plurality of sub-display panel regions 100A, and the conductive portion 30 may be disposed in a region other than the sub-display panel regions 100A.

The disclosed organic light-emitting display motherboard may include the plurality of sub-display panel regions 100A. After the organic light-emitting display motherboard is manufactured, a plurality of organic light-emitting display panels may be obtained by cutting the regions other than the sub-display panel regions 100A through a cutting process.

Referring to FIG. 16, one organic light-emitting display motherboard includes four sub-display panel regions 100A for, which is for illustrative purposes and is not intended to limit the scope of the present disclosure. After the organic light-emitting display motherboard is manufactured, four organic light-emitting display panels may be obtained through a cutting process. In an actual production application, one organic light-emitting display motherboard may include five or more sub-display panel regions 100A, which is not limited by the present disclosure and may be determined according to various application scenarios.

In the disclosed embodiments, the mother base substrate 200 may be a hard substrate. For example, the mother base substrate 200 may be made of a glass material. In another embodiment, the mother base substrate 200 may be a flexible substrate. For example, the mother base substrate 200 may be made of a resin material. The material of the mother base substrate 200 is not limited by the present disclosure and may be determined according to various application scenarios.

The metal wire 10 may be disposed on the mother base substrate 200. Any appropriate films may be disposed between the metal wire 10 and the mother base substrate 200, which are not limited by the present disclosure. The material of the metal wire 10 may include a meta having desired electrical conductivity. The metal wire 10 may be configured to transmit an electrical signal. For example, the material of the metal wire 10 may include one type of metal, or two or more types of metal, etc. The specific metal material of the metal wire 10 and the function of the electrical signal transmitted by the metal wire 10 are not limited by the present disclosure and may be determined according to various application scenarios.

The first insulation layer 20 may cover the upper surface 11 of the metal wire. The first insulation layer 20 may have an insulating function and may prevent the metal wire 10 from electrical leakage. The first insulation layer 20 may protect the metal wire 10 from being damaged in subsequent manufacturing process of the organic light-emitting display panel. The first insulation layer 20 may be made of an organic material or an inorganic material, which is not limited by the present disclosure and may be determined according to various application scenarios.

The first insulation layer 20 may include at least one hollow portion 21 penetrating through the first insulation layer 20 along the thickness direction of the first insulation layer 20 and exposing a portion of the upper surface 11 of the metal wire. In the subsequent manufacturing process of the organic light-emitting display motherboard, the upper surface 11 of the metal wire in the region where the hollow portion 21 is located may not be protected by the first insulation layer 20 and, thus, may be exposed in the acid etching solution. In the acid etching solution, the first metal in the material of the metal wire 10 may easily lose electrons and become the first metal cations.

The organic light-emitting display motherboard may include a plurality of film layer structures. Portion of the material of the film layer structures may include metal silver. When patterning the film layer structures containing a metal material using an acid etching solution, the etching solution may include silver ions.

To suppress the phenomenon that the silver ions form metal particles on the upper surface 11 of the metal wire in the region where the hollow portion 21 is located, in the disclosed embodiments, the conductive portion 30, which is electrically connected to the metal wire 10, may be provided.

The reasons why the conductive portion 30 may be able to resolve the issue that the silver ions form metal particles on the upper surface 11 of the metal wire in the region where the hollow portion 21 is located may be referred to the foregoing description in the disclosed embodiments, and are not repeated herein.

In the disclosed embodiments, the conductive portion 30 may be provided and, thus, the upper surface 11 of the metal wire may maintain a substantially smooth and flat structure under the protection of the conductive portion 30. Accordingly, the issues of poor flatness of the subsequently manufactured film layers may be resolved, and the reliability of the organic light-emitting display panel may be improved.

In addition, the conductive portion 30 may not overlap with the hollow portion 21 along a direction 'z' perpendicular to the mother base substrate 200. That is, the conductive portion 30 may be disposed in a region other than the hollow portion 21, without damaging the hollow structure of the first insulation layer 20 and without affecting the structural design requirements of the organic light-emitting display motherboard.

In one embodiment, the sub-display panel region 100A may include a display region 'AA' and a non-display region 'BB'. The hollow portion 21 may have an annular shape and may be disposed in the non-display region 'BB'. In one embodiment, the non-display region 'BB' may include a first barrier spacer 'BA1' and a second barrier spacer 'BA2'. The first barrier spacer 'BA1' may be disposed around the display region 'AA', and the second barrier spacer 'BA2' may be disposed around the first barrier spacer 'BA1'. In one embodiment, the metal wire 10 may be a high-potential signal line PVDD, and the metal wire 10 may supply a high-potential voltage to a plurality of pixels in the display region.

The metal wire 10 may include a first main wire 101, a second main wire 102, and a plurality of wire traces 103. The first main wire 101 and the second main wire 102 may be disposed on two sides of the display region 'AA' opposing to each other. The plurality of wire traces 103 may be disposed in the display region 'AA'. The plurality of wire traces 103 may be electrically connected to the first main wire 101 and the second main wire 102 in the non-display region 'BB'. In one embodiment, the hollow portion 21 may be disposed in a region between the first barrier spacer 'BA1' and the display region 'AA'.

In the disclosed embodiments, the conductive portion 30 may be disposed in a region other than the sub-display panel regions 100A. In the cutting process, the conductive portion 30 may be cut away. The organic light-emitting display panel obtained by cutting may not include the conductive portion 30, and the structural design of the organic light-emitting display panel may not be affected.

Referring to FIGS. 16-17, the conductive portion 30 may include a plurality of sub-conductive portions 301. The sub-conductive portions 301 may overlap with the metal wire 10 in the direction perpendicular to the mother base substrate 200. In one embodiment, the exposed film edge of the conductive portion 30 in the etching solution may increase by providing the plurality of sub-conductive portions 301. On one hand, the contact area between the conductive portion 30 and silver ions may increase, facilitating the silver ions to obtain the electrons lost by the metal wire 10 through the conductive portion 30, and facilitating the silver ions to form metal particles on the surface of the conductive portion 30. On the other hand, the conductive portion 30 may promptly and sufficiently undergo a reduction reaction in the etching solution. Therefore, the phenomenon that the silver ions in the etching solution undergo a reduction reaction to form the metal particles, which are adhered to the upper surface 11 of the metal wire in the region where the hollow portion 21 is located, may be resolved, and the reliability of the organic light-emitting display motherboard may be improved.

In the disclosed organic light-emitting display panel, the display device and the organic light-emitting display motherboard, the first insulation layer may cover the upper surface of the metal wire. The first insulation layer may include at least one hollow portion penetrating through the first insulation layer along the thickness direction of the first insulation layer and exposing portion of the upper surface of the metal wire. In addition, the conductive portion, which is electrically connected to the metal wire, may be provided.

The work function of the material of the conductive portion may be larger than the work function of metal silver, such that the silver ions in the etching solution may be difficult to undergo a reduction reaction to form the metal particles, which are adhered to the upper surface of the metal wire in the region where the hollow portion is located. Because the work function of the conductive portion is larger than the work function of the material of the metal wire, the silver ions may easily undergo a reduction reaction on the surface of the conductive portion to form metal particles, which are adhered to the surface of the conductive portion. Therefore, the upper surface of the metal wire may maintain a substantially smooth and flat structure, thereby avoiding the precipitation of the metal particles. Accordingly, the reliability of the organic light-emitting display panel may be improved, the process yield of the organic light-emitting display panel may be greatly improved, and the production cost may be reduced, facilitating to promote large-scale production and industrial applications of the organic light-emitting display panel.

The description of the disclosed embodiments is provided to illustrate the present disclosure to those skilled in the art. modifications to these embodiments will be readily apparent to those skilled in the art, and the generic principles defined herein may be applied to other embodiments without departing from the spirit or scope of the disclosure. Thus, the present disclosure is not intended to be limited to the embodiments shown herein but is to be accorded the widest scope consistent with the principles and features disclosed herein.

What is claimed is:

1. An organic light-emitting display panel, comprising:
   a base substrate;
   a metal wire disposed on the base substrate, wherein the metal wire has a first surface facing the base substrate and an opposing second surface, the opposing second surface is an upper surface of the metal wire, and a material of the metal wire includes a first metal;
   a first insulation layer covering the upper surface of the metal wire, wherein the first insulation layer includes at least one hollow portion, and the at least one hollow portion penetrates through the first insulation layer along a thickness direction of the first insulation layer and exposes a portion of the upper surface of the metal wire; and
   a conductive portion disposed on the upper surface of the metal wire, wherein along a direction perpendicular to the base substrate, the conductive portion is not overlapped with the at least one hollow portion, and the conductive portion is electrically connected to the metal wire,
   wherein a work function of a material of the conductive portion is G1, a work function of metal silver is G2, a work function of the first metal is G3, and G1>G2>G3.

2. The organic light-emitting display panel according to claim 1, wherein:
   the base substrate is a flexible substrate, and
   the organic light-emitting display panel includes a thin film encapsulation layer, wherein the thin film encapsulation layer covers the upper surface of the metal wire in a region where the at least one hollow portion is located.

3. The organic light-emitting display panel according to claim 2, further including:
a thin film transistor layer and an organic light-emitting diode layer sequentially disposed on the base substrate,
wherein the thin film transistor layer includes a gate metal layer, a semiconductor layer and a source-drain metal layer.

4. The organic light-emitting display panel according to claim 3, wherein:
the source-drain metal layer includes the metal wire.

5. The organic light-emitting display panel according to claim 3, further including:
a display region and a non-display region,
wherein the at least one hollow portion has an annular shape, and the at least one hollow portion is located in the non-display region.

6. The organic light-emitting display panel according to claim 5, wherein:
the non-display region includes a first barrier spacer and a second barrier spacer, wherein the second barrier spacer has a first side facing the display region and an opposing second side far away from the display region,
the first barrier spacer is disposed around the display region,
the second barrier spacer is disposed around the first barrier spacer,
the thin film encapsulation layer covers the display region and extends to the opposing second side of the second barrier spacer, and
the metal wire extends to a region at the opposing second side of the second barrier spacer from the display region.

7. The organic light-emitting display panel according to claim 6, wherein:
the at least one hollow portion is located in at least one of a region between the first barrier spacer and the second barrier spacer, a region between the first barrier spacer and the display region, and a region at the opposing second side of the second barrier spacer.

8. The organic light-emitting display panel according to claim 5, wherein:
the conductive portion is disposed in the non-display region.

9. The organic light-emitting display panel according to claim 5, wherein:
the non-display region includes a bonding region, wherein the bonding region includes a plurality of conductive welding pads, and
the conductive portion has a strip shape extended along a first direction and is disposed on a side of the display region, wherein the side of the display region is close to the bonding region.

10. The organic light-emitting display panel according to claim 3, wherein:
the organic light-emitting diode layer includes a plurality of organic light-emitting diodes,
an organic light-emitting diode includes an anode, a cathode, and an organic light-emitting portion disposed between the anode and the cathode,
the anode includes a first sub-layer, a second sub-layer and a third sub-layer stacked together, wherein materials of the first sub-layer and the third sub-layer include indium tin oxide, and a material of the second sub-layer includes silver, and
the conductive portion and the anode are made of a same material.

11. The organic light-emitting display panel according to claim 3, wherein:
the conductive portion has a first surface facing the base substrate and an opposing second surface, and
the organic light-emitting diode layer includes a pixel defining layer, wherein the pixel defining layer includes the opposing second surface of the conductive portion.

12. The organic light-emitting display panel according to claim 3, wherein:
the first insulation layer is a planarization layer, wherein the planarization layer is disposed between the thin film transistor layer and the organic light-emitting diode layer.

13. The organic light-emitting display panel according to claim 1, wherein:
the first metal includes aluminum.

14. The organic light-emitting display panel according to claim 1, further including:
a plurality of pixels, wherein a pixel includes a pixel circuit,
the pixel circuit includes an organic light-emitting diode, a driving transistor, a high-potential signal line and a low-potential signal line,
wherein the high-potential signal line is electrically connected to a source of the driving transistor, a drain of the driving transistor is electrically connected to an anode of the organic light-emitting diode, and the low-potential signal line is electrically connected to a cathode of the organic light-emitting diode, and
the metal wire is the high-potential signal line.

15. The organic light-emitting display panel according to claim 1, wherein:
the material of the conductive portion includes a conductive metal oxide, wherein the conductive metal oxide includes at least one of indium oxide, zinc oxide, tin oxide, and gallium oxide.

16. The organic light-emitting display panel according to claim 1, wherein:
the conductive portion includes a plurality of sub-conductive portions, wherein a sun-conductive portion is overlapped with the metal wire in the direction perpendicular to the base substrate.

17. The organic light-emitting display panel according to claim 1, wherein:
the first insulation layer has a first surface facing the base substrate and an opposing second surface,
the conductive portion is disposed on the opposing second surface of the first insulation layer,
the first insulation layer includes a first through-hole, and
the conductive portion is electrically connected to the metal wire through the first through-hole.

18. A display device, comprising:
an organic light-emitting display panel, including:
a base substrate,
a metal wire disposed on the base substrate, wherein the metal wire has a first surface facing the base substrate and an opposing second surface, the opposing second surface is an upper surface of the metal wire, and a material of the metal wire includes a first metal,
a first insulation layer covering the upper surface of the metal wire, wherein the first insulation layer includes at least one hollow portion, and the at least one hollow portion penetrates through the first insulation layer along a thickness direction of the first insulation layer and exposes a portion of the upper surface of the metal wire, and a conductive portion disposed on the upper surface of the metal wire, wherein along a direction perpendicular to the base substrate, the conductive portion is not overlapped with the at least one hollow portion, and the conductive portion is electrically connected to the metal wire, wherein a work function of a material of the conductive portion is G1, a work function of metal silver is G2, a work function of the first metal is G3, and G1>G2>G3.

19. An organic light-emitting display motherboard, comprising:

a mother base substrate;

a metal wire disposed on the mother base substrate, wherein the metal wire has a first surface facing the mother base substrate and an opposing second surface, the opposing second surface is an upper surface of the metal wire, and a material of the metal wire includes a first metal;

a first insulation layer covering the upper surface of the metal wire, wherein the first insulation layer includes at least one hollow portion, and the at least one hollow portion penetrates through the first insulation layer along a thickness direction of the first insulation layer and exposes a portion of the upper surface of the metal wire;

a conductive portion disposed on the upper surface of the metal wire, wherein along a direction perpendicular to the mother base substrate, the conductive portion is not overlapped with the at least one hollow portion, and the conductive portion is electrically connected to the metal wire, wherein a work function of a material of the conductive portion is G1, a work function of metal silver is G2, a work function of the first metal is G3, and G1>G2>G3; and a plurality of sub-display panel regions, wherein the conductive portion is disposed in a region other than a sub-display panel region.

20. The organic light-emitting display motherboard according to claim 19, wherein:

the conductive portion includes a plurality of sub-conductive portions, wherein a sub-conductive portion is overlapped with the metal wire in the direction perpendicular to the mother base substrate.

* * * * *